US011150772B2

(12) United States Patent
Lee et al.

(10) Patent No.: US 11,150,772 B2
(45) Date of Patent: *Oct. 19, 2021

(54) DISPLAY DEVICE HAVING A NON-DISPLAY AREA WITH A SENSING PORTION AND A NON-SENSING PORTION

(71) Applicant: SAMSUNG DISPLAY CO., LTD., Yongin-si (KR)

(72) Inventors: Choon Hyop Lee, Suwon-si (KR); Ga Yeon Yun, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/933,489

(22) Filed: Jul. 20, 2020

(65) Prior Publication Data

US 2020/0348779 A1 Nov. 5, 2020

Related U.S. Application Data

(62) Division of application No. 16/110,770, filed on Aug. 23, 2018, now Pat. No. 10,747,380.

(30) Foreign Application Priority Data

Sep. 22, 2017 (KR) .......................... 10-2017-0122747

(51) Int. Cl.
| | |
|---|---|
| *G06F 3/044* | (2006.01) |
| *G06F 3/041* | (2006.01) |
| *G06F 3/045* | (2006.01) |
| *G02F 1/1333* | (2006.01) |
| *H01L 27/32* | (2006.01) |

(52) U.S. Cl.
CPC ............ *G06F 3/0447* (2019.05); *G06F 3/041* (2013.01); *G06F 3/044* (2013.01); *G06F 3/0445* (2019.05); *G02F 1/13338* (2013.01); *G06F 3/045* (2013.01); *G06F 3/0412* (2013.01); *G06F 2203/04105* (2013.01); *G06F 2203/04107* (2013.01); *H01L 27/323* (2013.01)

(58) Field of Classification Search
None
See application file for complete search history.

(56) References Cited

U.S. PATENT DOCUMENTS

| | | | |
|---|---|---|---|
| 7,656,393 B2 | 2/2010 | King et al. | |
| 10,747,380 B2 * | 8/2020 | Lee | ......................... G06F 3/041 |

(Continued)

FOREIGN PATENT DOCUMENTS

| | | |
|---|---|---|
| KR | 20170034364 | 3/2017 |
| KR | 20170071635 | 6/2017 |

*Primary Examiner* — Aneeta Yodichkas
(74) *Attorney, Agent, or Firm* — F. Chau & Associates, LLC

(57) ABSTRACT

A display device includes a display panel having a display portion. A window is disposed above the display portion. The window includes a display area, on which a screen is displayed by the display portion, and a non-display area, disposed around the display area. The non-display area of the window includes a sensing portion and a non-sensing portion. The non-display area of the window includes a first light shielding member. The sensing portion includes a first conductive layer and a second conductive layer stacked on the first conductive layer with the first light shielding member interposed therebetween.

16 Claims, 29 Drawing Sheets

(56) References Cited

U.S. PATENT DOCUMENTS

2009/0095005 A1     4/2009   Dietrich et al.
2009/0117944 A1     5/2009   Lee et al.
2010/0188363 A1     7/2010   Ikeda et al.
2014/0132551 A1     5/2014   Bathiche

* cited by examiner

DISPLAY DEVICE HAVING A NON-DISPLAY AREA WITH A SENSING PORTION AND A NON-SENSING PORTION

CROSS-REFERENCE TO RELATED APPLICATION

This application is a Division of co-pending U.S. patent application Ser. No. 16/110,770, filed on Aug. 23, 2018, which claims priority to Korean Patent Application No. 10-2017-0122747, filed on Sep. 22, 2017, in the Korean Intellectual Property Office, and all the benefits accruing therefrom under 35 U.S.C. § 119, the disclosures of which are herein incorporated by reference in their entirety.

TECHNICAL FIELD

The present inventive concept relates to a display device and, more specifically, to a display device having a non-display area with a sensing portion and a non-sensing portion.

DISCUSSION OF THE RELATED ART

With the proliferation of multimedia, display devices are becoming increasingly important. Accordingly, various types of display devices such as liquid crystal displays (LCDs) and organic light emitting diode (OLED) displays are being used.

A display device may include a touch panel which senses the position of a user's touch. The touch panel may be configured to identify both a location of a touch event on the display panel and a pressure of the touch event.

By providing a display device with a touch panel, input and output may be conveniently accommodated.

SUMMARY

A display device includes a display panel having a display portion. A window is disposed above the display portion. The window includes a display area, on which a screen is displayed by the display portion, and a non-display area, disposed around the display area. The non-display area of the window includes a sensing portion and a non-sensing portion. The non-display area of the window includes a first light shielding member. The sensing portion includes a first conductive layer and a second conductive layer stacked on the first conductive layer with the first light shielding member interposed therebetween.

A display device includes a display panel with a display portion. A window is disposed above the display portion. The window includes a display area, on which a screen is displayed by the display portion, and a non-display area, disposed around the display area. The non-display area of the window includes a first sensing portion and a second sensing portion. The non-display area of the window includes a light shielding member. The first sensing portion includes a first conductive layer, a second conductive layer stacked on the first conductive layer, and a light shielding member interposed between the first conductive layer and the second conductive layer. The second sensing portion includes a third conductive layer, a fourth conductive layer stacked on the third conductive layer, and the light shielding member interposed between the third conductive layer and the fourth conductive layer.

A display device includes a display panel including a display portion. A window is disposed above the display portion. The window includes a display area, on which a screen is displayed by the display portion, and a non-display area, which is disposed around the display area. The non-display area includes a pressure sensing unit. The window further includes a light shielding member disposed in the non-display area. The pressure sensing unit comprises a first conductive layer, a dielectric layer disposed on the first conductive layer and made of the light shielding member, and a second conductive layer disposed on the dielectric layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
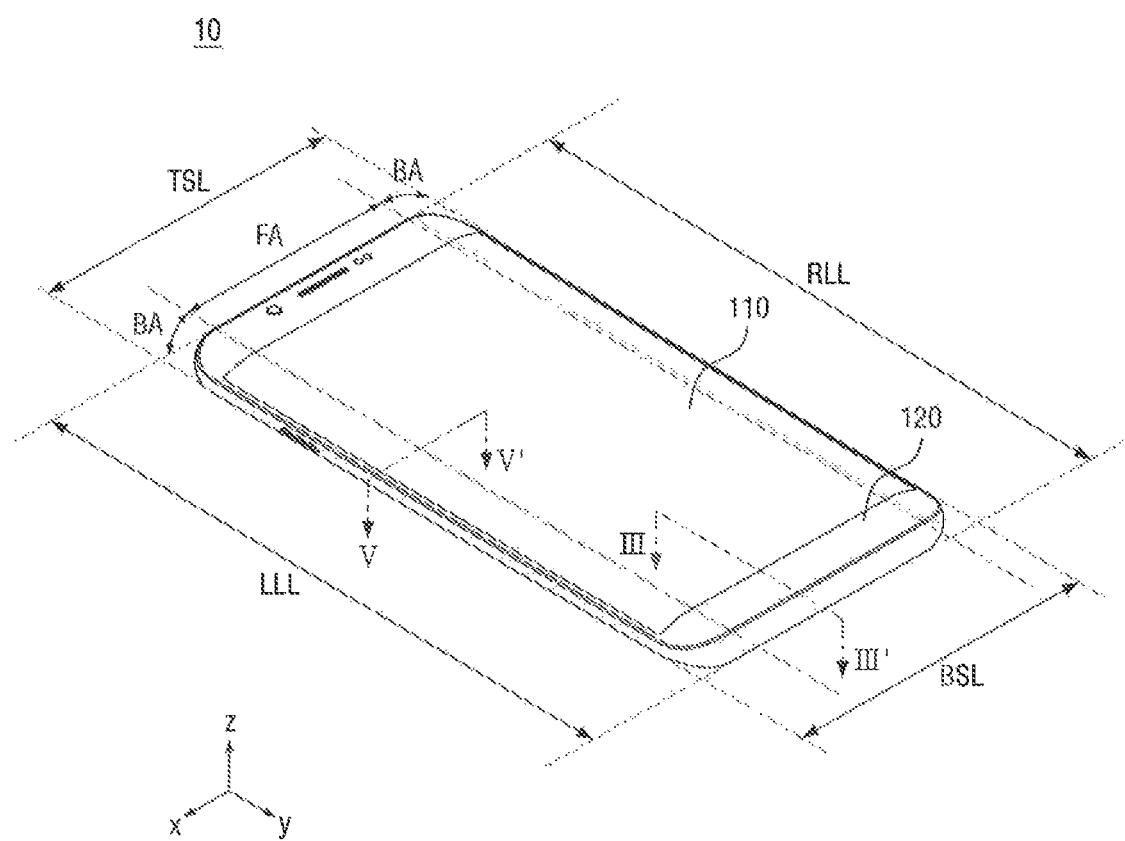
FIG. 1 is a perspective view illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

It will be understood that when an element or layer is referred to as being "on," "connected to" or "coupled to" another element or layer, the element or layer can be directly on, connected or coupled to another element or layer or intervening elements or layers may be disposed therebetween. As used herein, the term "connected" may refer to elements being physically, electrically and/or fluidly connected to each other.

Like numbers may refer to like elements throughout the specification and drawings. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, exemplary embodiments of the present disclosure will be described with reference to the attached drawings.

Figure 2:
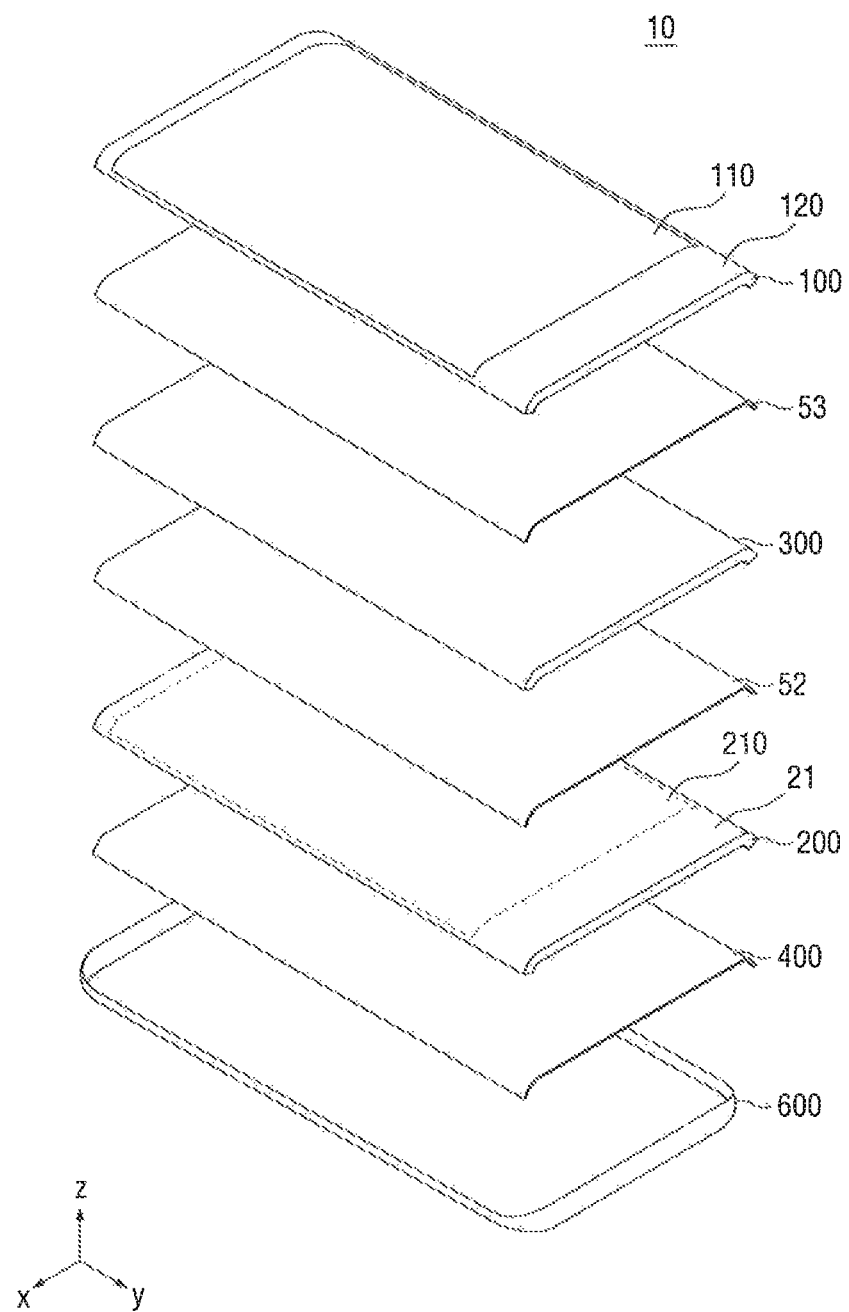
FIG. 2 is an exploded perspective view illustrating the display device of FIG. 1.
Figure 3:
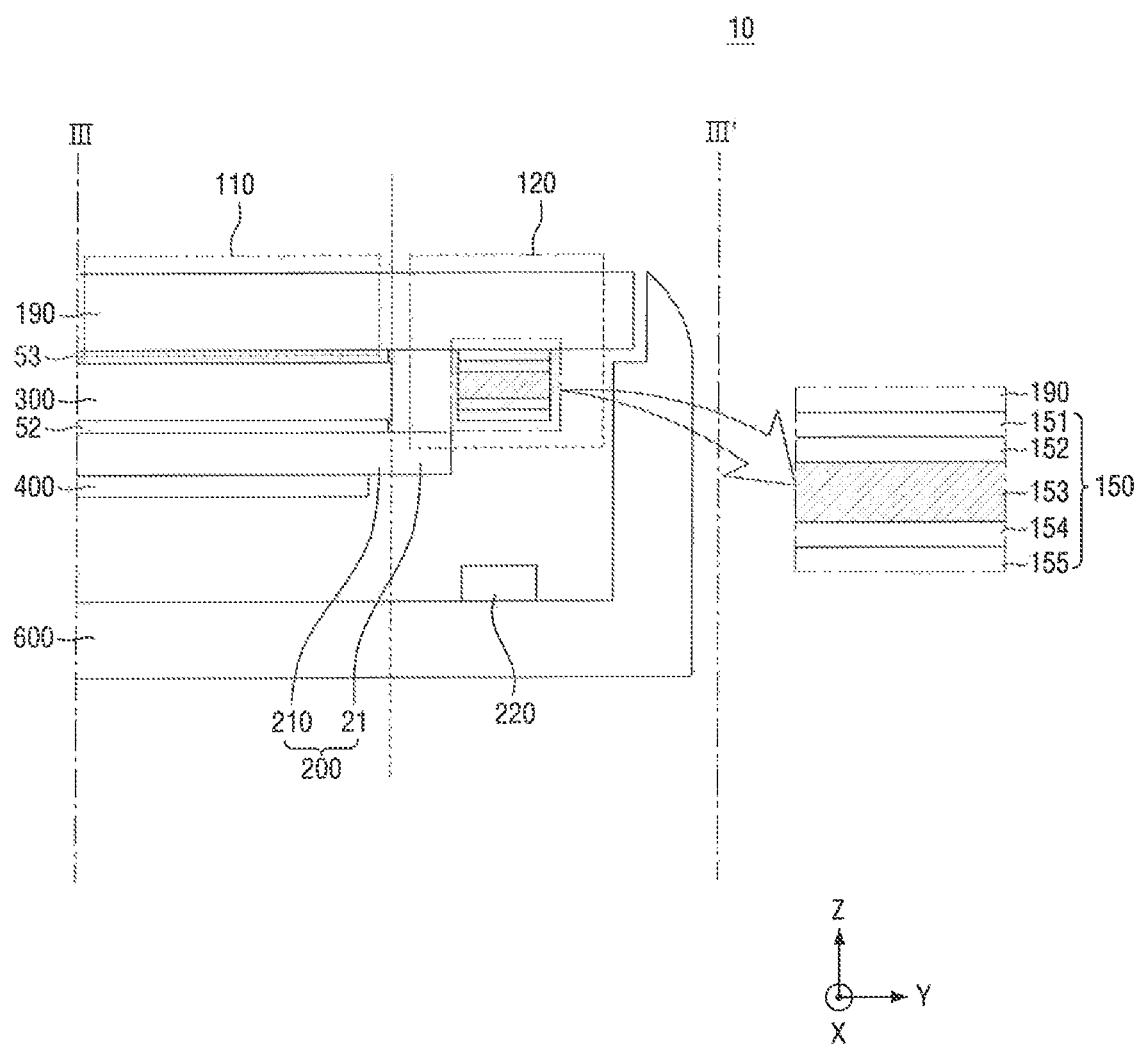
FIG. 3 is a cross-sectional view illustrating a first example of the display device of FIG. 1, taken along the line III-III'.
Figure 4:
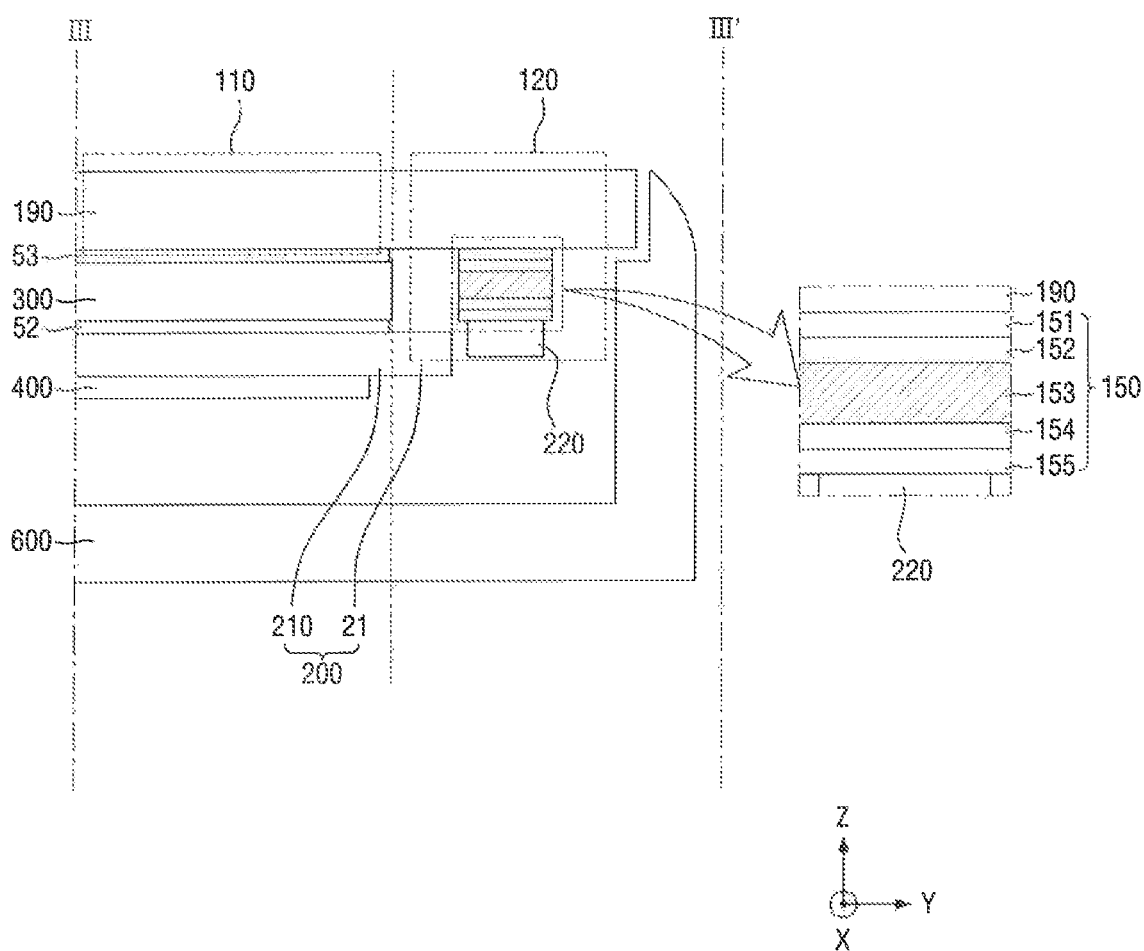
FIG. 4 is a cross-sectional view illustrating a second example of the display device of FIG. 1, taken along the line III-III'.
Figure 5:
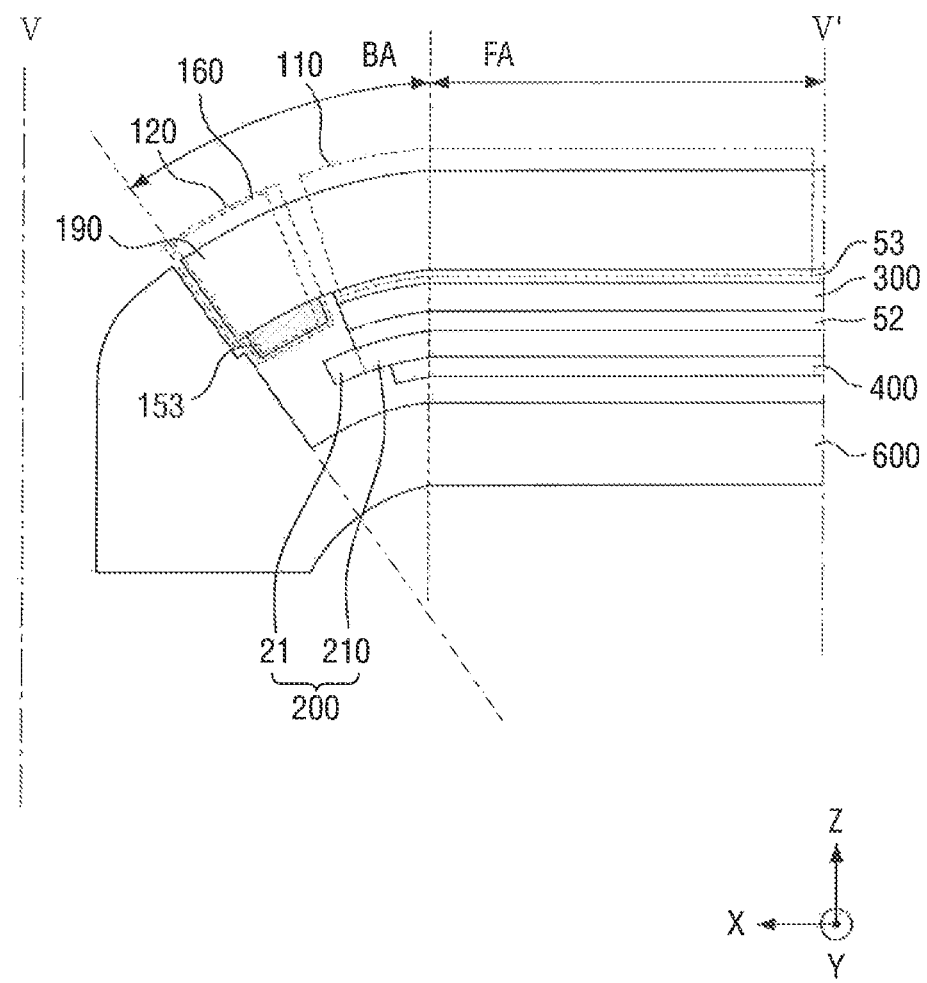
FIG. 5 is a cross-sectional view taken along the line V-V' of FIG. 1.

FIG. 1 is a perspective view illustrating a display device 10 according to an exemplary embodiment of the present disclosure. FIG. 2 is an exploded perspective view illustrating the display device 10 of FIG. 1. FIG. 3 is a partial cross-sectional view of an example of the display device 10 of FIG. 1, taken along the line III-III'. FIG. 4 is a partial cross-sectional view of an example of the display device 10 of FIG. 1, taken along the line III-III'. FIG. 5 is a partial cross-sectional view taken along the line V-V' of FIG. 1.

Referring to FIGS. 1 through 5, the display device 10 includes a window 100 and a display panel 200. The display device 10 may further include an under-panel sheet 400 disposed under the display panel 200 and a bracket 600 disposed under the under-panel sheet 400.

Unless otherwise defined, the terms "above," "top," and "upper surface" used herein denote a display surface side of the display panel 200, and the terms "under," "bottom," and "lower surface" used herein denote an opposite side of the display panel 200 from the display surface side.

The display device 10 may have a substantially rectangular shape. The display device 10 may include two long sides and two short sides. The long sides may include a left long side LLL of the display device 10 and a right long side RLL of the display device 10. Both short sides may include a top short side TSL and a bottom short side BSL. Corners at which the long sides and the short sides of the display device 10 meet may be at right angles. However, the corners can also form curved surfaces as illustrated in FIG. 1. The planar shape of the display device 10 is not limited to the above example and can be a circular shape or various other shapes.

The display device 10 may include a flat portion FA and a bending portion BA connected to the flat portion FA and disposed around the flat portion FA. The flat portion FA generally lies in one plane. The bending portion BA does not lie entirely in the same plane as the flat portion FA. For example, the bending portion BA may be bent or curved in a downward direction from the plane where the flat portion FA is disposed.

The bending portion BA may include a surface curved convexly in an outward direction. According to an exemplary embodiment of the present disclosure, the bending portion BA may have a flat surface, and the flat surface of the bending portion BA may be disposed in a plane at a predetermined angle with respect to the plane of the flat portion FA.

The bending portion BA may be disposed on the left long side LLL and the right long side RLL of the display device 10, as illustrated in the drawings. Alternatively, according to an exemplary embodiment of the present disclosure, the bending portion BA may be disposed on either the left long side LLL or the right long side RLL of the display device 10 or may be disposed on the top short side TSL and/or the bottom short side BSL of the display device 10. Alternatively, the bending portion BA may be disposed adjacent to the left long side LLL, the right long side RLL, the top short side TSL and the bottom short side BSL of the display device 10.

The display device 10 may be a flat display device having only a flat portion and not having a bending portion. The disclosure provided herein may apply either to flat display devices or bent display devices.

The display panel 200 may be disposed inside the display device 10. According to an exemplary embodiment of the present disclosure, the display panel 200, like the display device 10, may include a flat portion and a bending portion connected to the flat portion and disposed around the flat portion. The flat portion and the bending portion described here may be at least similar to the corresponding portions described above.

The display panel 200 includes a display portion 210 and a non-display portion 21. The display portion 210 is configured to display an image and the display portion 210 overlaps with and is substantially aligned with a display area 110 of the window 100. No image is displayed within the non-display portion 21. The non-display portion 21 may be disposed around the display portion 210 and may overlap with and be substantially aligned with a non-display area 120 of the window 100.

In some exemplary embodiments of the present disclosure, the display panel 200 may include a self-luminous element. The self-luminous element may be an organic light emitting diode, a quantum dot light emitting diode (LED), and/or an inorganic material-based ultra-small LED (e.g., a micro LED). However, the display panel 200 may also be another type of display panel such as a liquid crystal display (LCD) panel.

A touch member (or touch sensor) 300 may be disposed on the display panel 200. The touch member 300 may acquire coordinate information of a point where a touch event occurs by using a resistive film method, a mutual capacitance method, and/or a self-capacitance method. According to an exemplary embodiment of the present disclosure, the display panel 200 and the touch member 300 may be bonded together by a transparent bonding layer 52 such as an optically clear adhesive (OCA) or an optically clear resin (OCR). Alternatively, according to an exemplary embodiment of the present disclosure, the touch member 300 may be integrated with the display panel 200.

The touch member 300 may be rigid, flexible, or of a film type. The touch member 300 may have substantially the same size and shape as the display panel 200 and may overlap the display panel 200. Side surfaces of the touch member 300 may be, but not are not necessarily, aligned with side surfaces of the display panel 200.

The window 100 is disposed above the display panel 200. When the touch member 300 is disposed on the display panel 200, the window 100 may be disposed on the touch member 300. The touch member 300 and the window 100 may be bonded together by a transparent bonding layer 53 such as an OCA or an OCR. If the touch member 300 is omitted, the display panel 200 and the window 100 may be bonded together by an OCA or an OCR.

As is shown on FIG. 3, the window 100 includes a substrate 190. The substrate 190 may overlap the display panel 200 and cover the entire surface of the display panel 200. The substrate 190 may be larger than the display panel 200. For example, the substrate 190 may protrude outward from the display panel 200 at both short sides TSL and BSL of the display device 10. The substrate 190 can also protrude from the display panel 200 at both long sides LLL and RLL of the display device 10. However, the protruding distance of the substrate 190 may be greater at the long sides than at the short sides.

Like the display device 10, the substrate 190 may include a flat portion and a bending portion connected to the flat portion and disposed around the flat portion. The flat portion and the bending portion may be at least similar to those of the display device 10 described above.

The substrate 190 may include a light transmitting material such as glass, sapphire, or plastic. The substrate 190 may be rigid. However, the substrate 190 can also be flexible.

The substrate 190 protects the display panel 200 and/or the touch member 300 while allowing light emerging from the display panel 200 to pass therethrough.

The window 100 includes the display area 110 and the non-display area 120 disposed around the display area 110.

The display area 110 may overlap and substantially align with the display portion 210 of the display panel 200. Light generated and output in the form of an image by the display portion 210 may be provided to the outside of the display device 10 via the display area 110.

The display area 110 may include the center of the window 100. The display area 110 may be shaped like a rectangle including the center of the window 100. The display area 110 described below may be rectangular. While a case where the display area 110 is rectangular is primarily described and shown herein, it is to be understood that the display area 110 can also have another shape such as a square shape, a circular shape, an elliptical shape, or a polygonal shape.

According to an exemplary embodiment of the present disclosure, the display area 110, like the display device 10, may include a flat portion and a bending portion connected to the flat portion and disposed around the flat portion. Alternatively, according to an exemplary embodiment of the present disclosure, the display area 110 may include only a flat portion and might not include a bending portion. The flat portion and the bending portion may be at least similar to the display device 10 described above.

The non-display area 120 is disposed around the display area 110 disposed at the center of the window 100. The non-display area 120 includes a portion of the substrate 190.

The non-display area 120 may include an area (hereinafter, referred to as a 'long side adjacent area') extending along the left long side LLL of the display device 10 and the right long side RLL of the display device 10, for example, an area extending along a second direction Y, and an area (hereinafter, referred to as a 'short side adjacent area') extending along the top short side TSL and the bottom short side BSL of the display device 10, for example, an area extending along a first direction X intersecting the second direction Y.

The non-display area 120 includes a light shielding member 153 disposed on a lower surface of the substrate 190 which faces the display panel 200. The light shielding member 153 prevents a structure under the window 100 from being seen through the display device 10. A portion of the light shielding member 153 is disposed in the short side adjacent area of the non-display area 120, and the other portion of the light shielding member 153 is disposed in the long side adjacent area of the non-display area 120.

The light shielding member 153 may include a material that is deformable by an external force, for example, an elastic material. According to an exemplary embodiment of the present disclosure, the light shielding member 153 may include a black matrix BM.

The black matrix may block the transmission of light, may include an organic material, and may include a light shielding material that blocks light.

As can be seen in FIGS. 3, 4, and 5, the non-display area 120 may be divided into a sensing portion 150 and a non-sensing portion 160.

The sensing portion 150 may include at least one key. According to an exemplary embodiment of the present disclosure, the key may be a soft key. As used herein, the term "soft key" may mean an input element such as a button or other touch-sensitive element whose function may be controlled (and changed) by software. The soft key may be a mechanical button that is depressible, or may be a touch-sensitive area that is not depressible. The soft key may have an identifying symbol or word thereon that is representative of the present function of the soft key, and the identifying symbol and word may be changed as the function changes, for example. According to an exemplary embodiment of the present disclosure, the sensing portion 150 may be disposed in the short side adjacent area of the non-display area 120.

The sensing portion 150 may be disposed on the lower surface of the substrate 190 in the short side adjacent area of the non-display area 120.

The sensing portion 150 may include the light shielding member 153, an a first conductive layer 152, and a second conductive layer 154 stacked on the first conductive layer 152 with the light shielding member 153 interposed therebetween. The sensing portion 150 may further include a first insulating layer 151 and a second insulating layer 155.

The first conductive layer 152 is disposed between the substrate 190 and the light shielding member 153. The second conductive layer 154 is disposed opposite to the first conductive layer 152 with the light shielding member 153 interposed between the first conductive layer 152 and the second conductive layer 154.

The first conductive layer 152 and the second conductive layer 154 may each include a conductive material. According to an exemplary embodiment of the present disclosure, the conductive material may include a metal material such as molybdenum, silver, titanium, copper, aluminum, and alloys of the same. Alternatively, the conductive material may include a transparent conductive oxide such as indium tin oxide (ITO), indium zinc oxide (IZO), zinc oxide (ZnO), or indium tin zinc oxide (ITZO). Alternatively, the conductive material may include a conductive polymer such as PEDOT, metal nanowires, or graphene. If the conductive material includes metal nanowires, the first conductive layer 152 and/or the second conductive layer 154 may be formed as a metal mesh. According to some exemplary embodiments of the present disclosure, the first conductive layer 152 and the second conductive layer 154 may include the same material.

Figure 11:
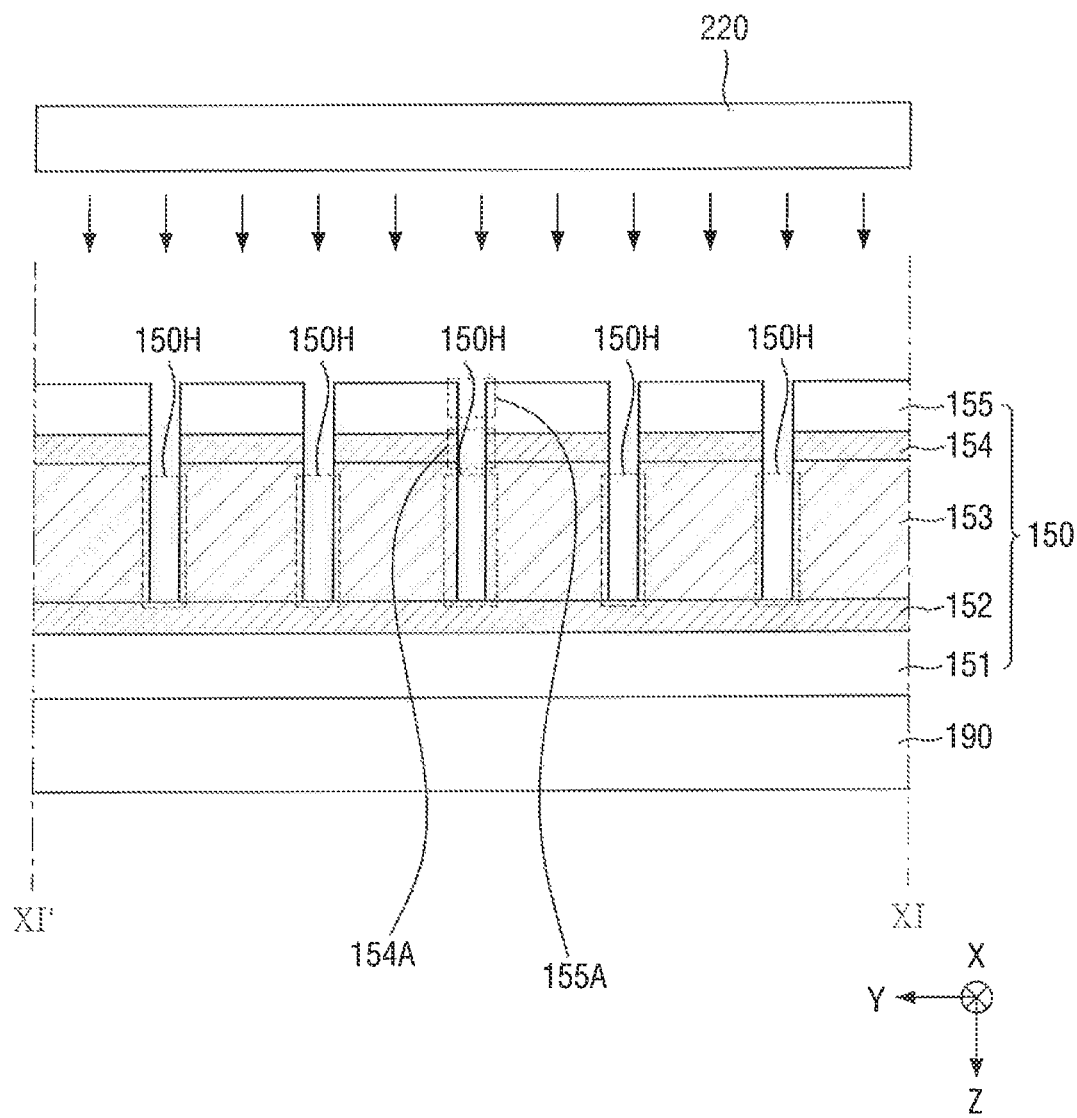
FIG. 11 is a cross-sectional view taken along the line XI-XI' of FIG. 10.

As can be seen in FIG. 11, a plurality of first holes 150H are formed in the light shielding member 153 of the sensing portion 150. The first holes 150H provide a path through which light emitted from a light source 220 travels. In addition, the first holes 150H improve the touch pressure sensing sensitivity of the sensing portion 150. The first holes 150H will be described in greater detail below.

The first insulating layer 151 may be disposed between the first conductive layer 152 and the substrate 190.

According to an exemplary embodiment of the present disclosure, the first insulating layer 151 may include an inorganic material, an organic material having photosensitivity and excellent planarization characteristics, or a composite material of the inorganic material and the organic material. The first insulating layer 151 may planarize the lower surface of the substrate 190 and/or may function to bond the substrate 190 and the first conductive layer 152 to each other.

The second insulating layer 155 may be disposed under the second conductive layer 154. For example, the second conductive layer 154 may be disposed between the second insulating layer 155 and the light shielding member 153.

Like the first insulating layer 151, the second insulating layer 155 may include an inorganic material, an organic material having photosensitivity and excellent planarization characteristics, or a composite material of the inorganic material and the organic material. The second insulating layer 155 may protect the second conductive layer 154.

For example, according to an exemplary embodiment of the present disclosure, the sensing portion 150 may include the first insulating layer 151, the first conductive layer 152, the light shielding member 153, the second conductive layer 154 and the second insulating layer 155 stacked sequentially on the lower surface of the substrate 190 in the non-display area 120 of the substrate 190. The first conductive layer 152, the second conductive layer 154 and the light shielding member 153 may together form a pressure sensor. The first conductive layer 152 may function as a first electrode of the pressure sensor, the second conductive layer 154 may function as a second electrode of the pressure sensor, and the light shielding member 153 may function as an elastic dielectric of the pressure sensor. The operation of the first conductive layer 152, the second conductive layer 154 and the light shielding member 153 as the pressure sensor will be described later with reference to FIG. 13.

A soft key may be displayed on the sensing portion 150 of the display device 10.

The display device 10 may further include the light source 220 that is disposed under the sensing portion 150 and is overlapped by the sensing portion 150. The light source 220 may provide light to the sensing portion 150 to display the soft key.

The light source 220 may overlap the sensing portion 150. According to an exemplary embodiment of the present disclosure, the light source 220 may be disposed on a bottom surface of the bracket 600 so as to overlap the sensing portion 150 and the light source 220 may be separated from the sensing portion 150 by a space, as illustrated in FIG. 3. Alternatively, the light source 220 may be disposed under the sensing portion 150 and may be bonded to the sensing portion 150, as illustrated in FIG. 4. According to some exemplary embodiments of the present disclosure, the light source 220 may be an LED. Light emitted from the light source 220 may partially pass through the non-display area 120. Accordingly, the soft key may be displayed on the sensing portion 150. In the following description, a case where the light source 220 is separated from the sensing portion 150 by a space as illustrated in FIG. 3 will be described as an example. Additional details will be provided below with reference to FIGS. 6 through 11.

The non-sensing portion 160 may be a portion of the non-display area 120 other than the sensing portion 150.

According to an exemplary embodiment of the present disclosure, the non-sensing portion 160 may be disposed in the long side adjacent area of the non-display area 120.

The non-sensing portion 160 may include the substrate 190 and a portion of the light shielding member 153 disposed under the substrate 190.

The under-panel sheet 400 is disposed under the display panel 200. The under-panel sheet 400 may include a top bonding layer at the top thereof and may be attached to a lower surface of the display panel 200 by the top bonding layer.

The under-panel sheet 400 may have substantially the same size and shape as the display panel 200. Side surfaces of the under-panel sheet 400 may optionally be aligned with the side surfaces of the display panel 200. The under-panel sheet 400 may perform a heat dissipating function, an electromagnetic wave shielding function, a pattern detection preventing function, a grounding function, a buffering function, a strength enhancing function and/or a digitizing function. The under-panel sheet 400 may include a functional layer having at least one of the above functions. The functional layer can be provided in various forms such as a layer, a membrane, a film, a sheet, a plate, or a panel.

The under-panel sheet 400 may include one functional layer or a plurality of functional layers. When the under-panel sheet 400 includes a plurality of functional layers, the functional layers may be stacked to overlap each other. In this case, a functional layer may be stacked directly on another functional layer or may be stacked on another functional layer by a bonding layer.

The bracket 600 is disposed under the under-panel sheet 400. The bracket 600 houses the window 100, the touch member 300, the display panel 200, and the under-panel sheet 400. The bracket 600 may include the bottom surface and sidewalls. The bottom surface of the bracket 600 faces a lower surface of the under-panel sheet 400, and the sidewalls of the bracket 600 face the side surfaces of the window 100, the touch member 300, the display panel 200 and the under-panel sheet 400. The under-panel sheet 400 may include a bottom bonding member at the bottom thereof and may be attached to the bottom surface of the bracket 600 by the bottom bonding member.

Although not illustrated in the drawings, a waterproof tape may be disposed on edges of the bottom surface of the bracket 600. The waterproof tape disposed adjacent to long sides of the bracket 600 may be attached to the lower surface of the under-panel sheet 400, and the waterproof tape disposed adjacent to short sides of the bracket 600 may be attached to a lower surface of the window 100.

The display panel 200, the touch member 300, the window 100, the under-panel sheet 400, and the bracket 600 described above may each be disposed over the flat portion FA and the bending portion BA.

Figure 6:
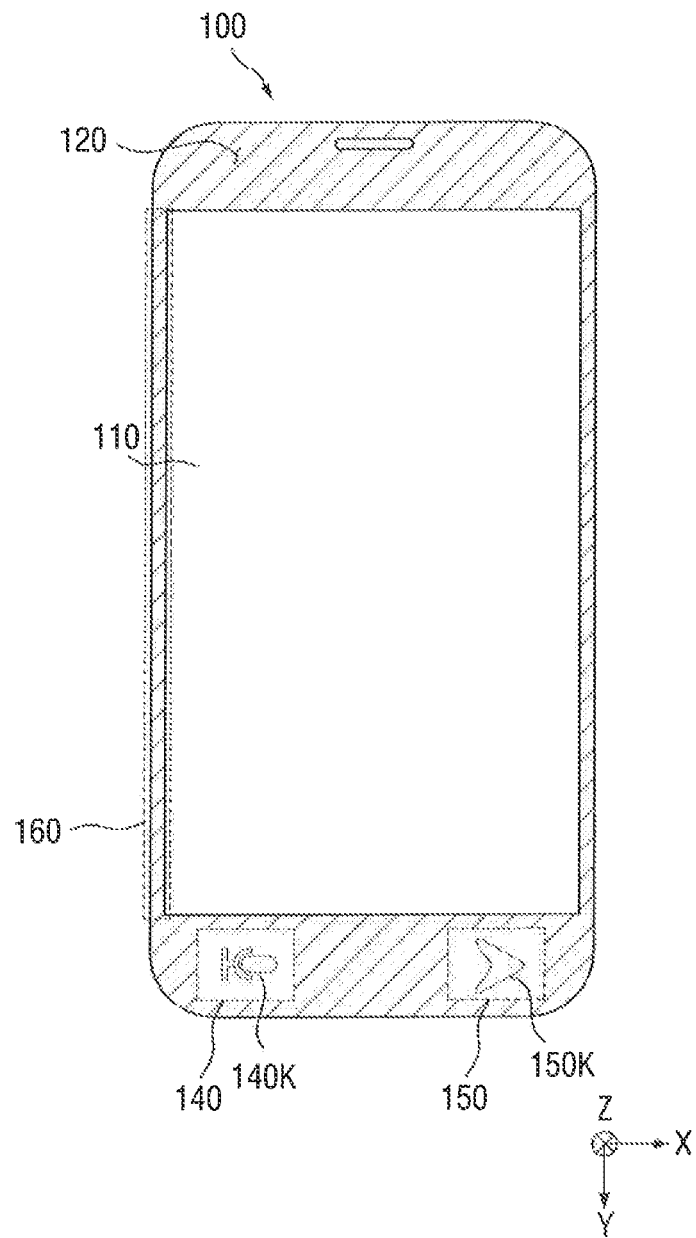
FIG. 6 is a rear view illustrating a window of an example of the display device of FIG. 1.
Figure 7:
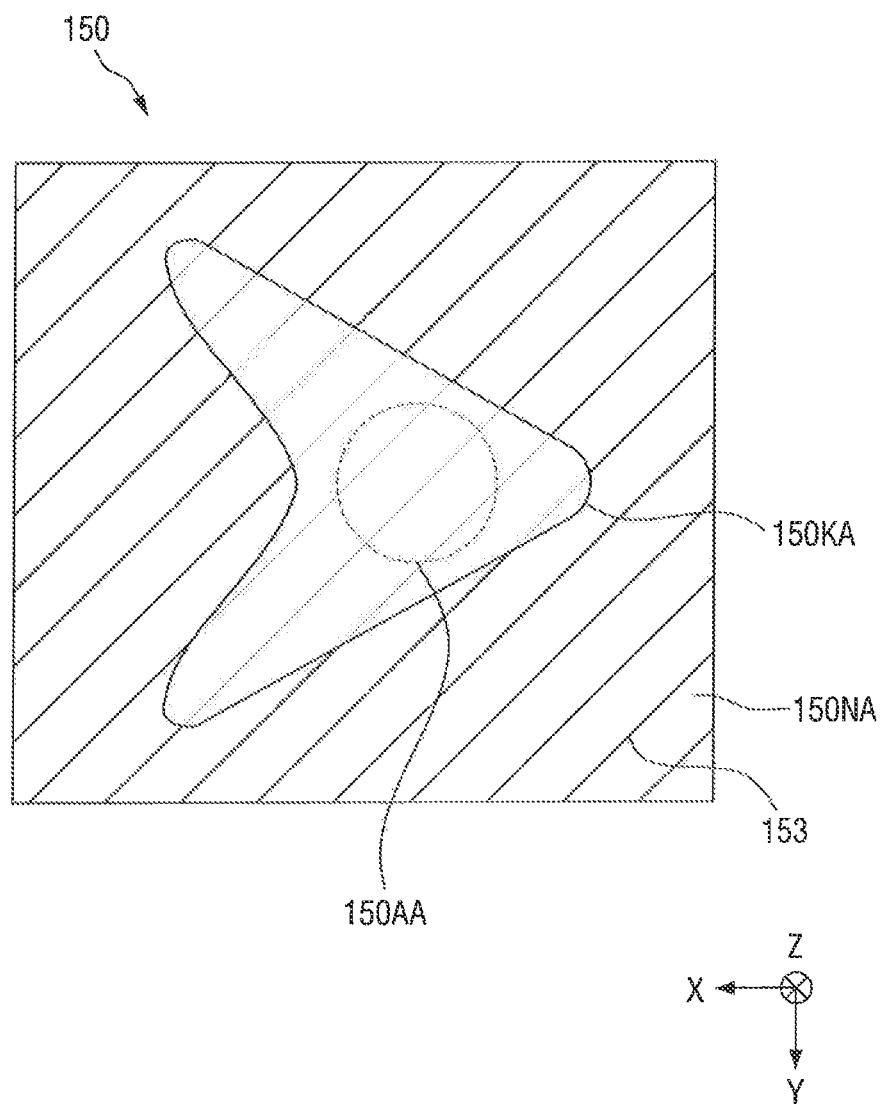
FIG. 7 is an enlarged bottom view of a first sensing portion of FIG. 6.
Figure 8:
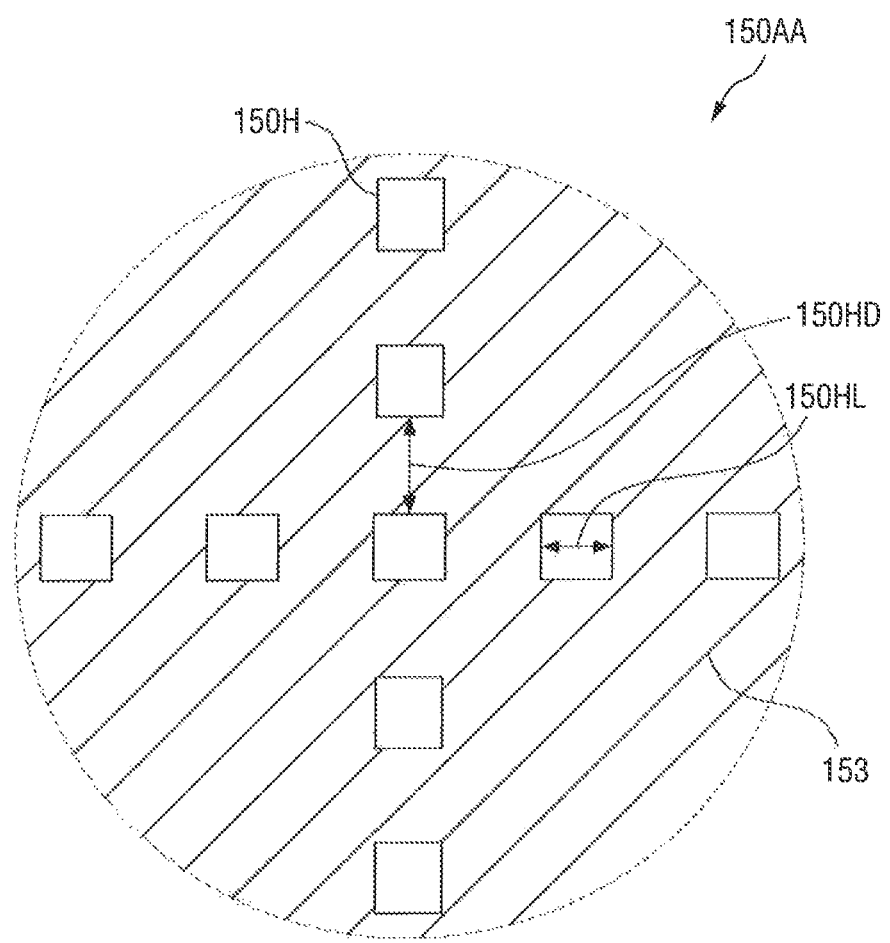
FIG. 8 is a first enlarged view of one unit area in FIG. 7.
Figure 9:
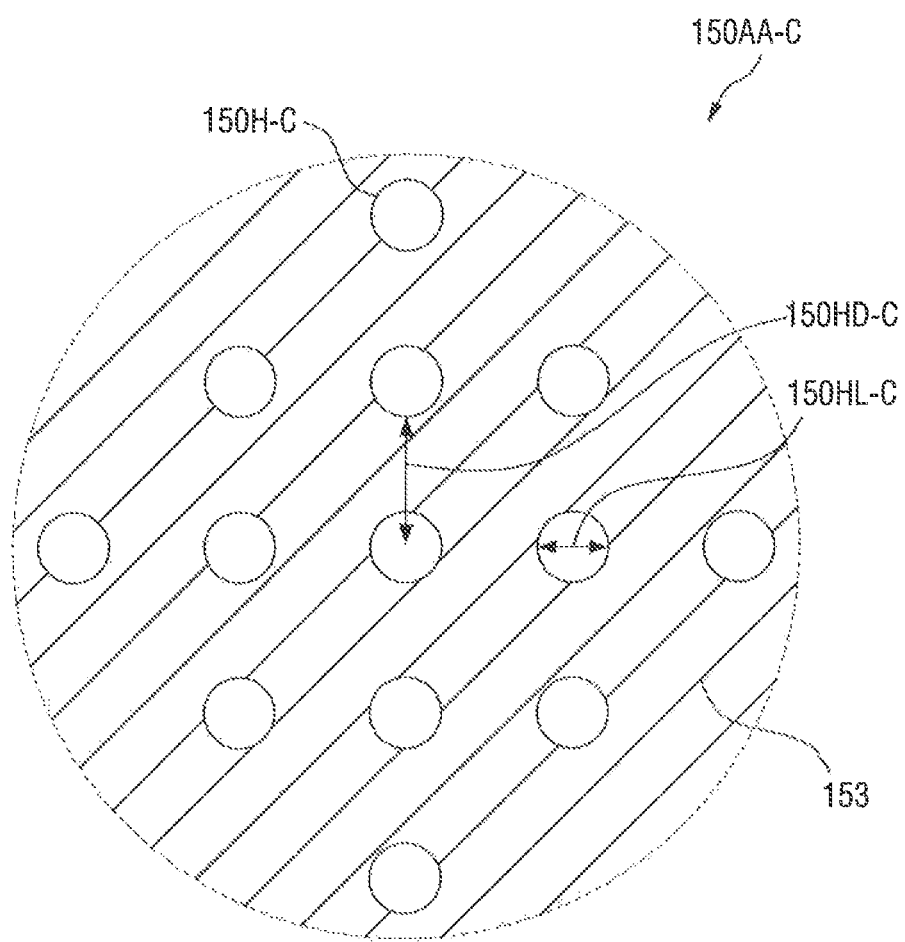
FIG. 9 is a second enlarged view of one unit area of FIG. 7.
Figure 10A:
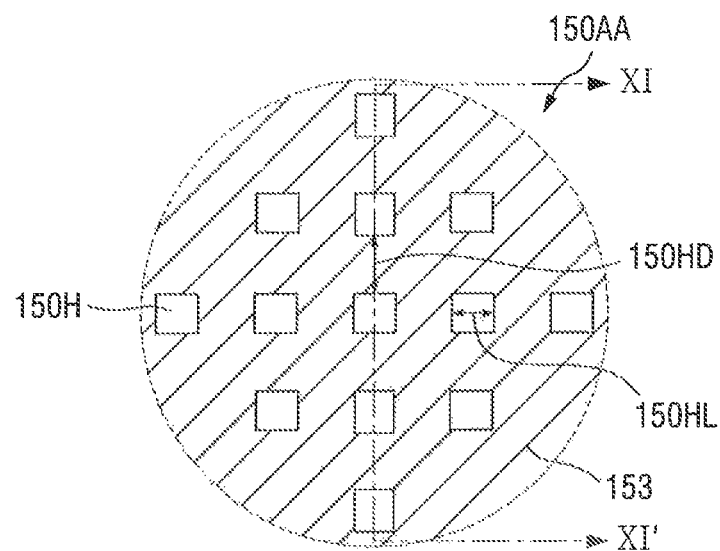
FIG. 10A is an enlarged view of one unit area of the first sensing portion of FIG. 7.
Figure 10B:
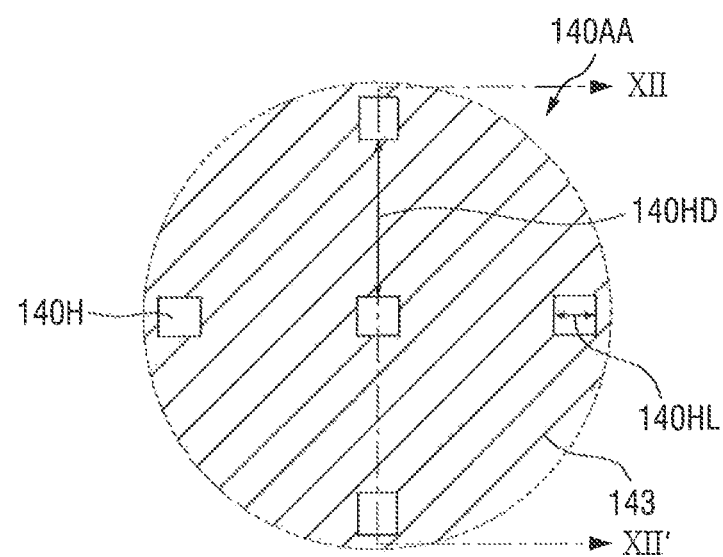
FIG. 10B is an enlarged view of one unit area of a second sensing portion of FIG. 6.

FIG. 6 is a rear view of a window 100 of the display device 10 of FIG. 1 according to an exemplary embodiment of the present disclosure. FIG. 7 is an enlarged bottom view of a first sensing portion 150 of FIG. 6. FIG. 8 is an enlarged view of one unit area 150AA in FIG. 7. FIG. 9 illustrates a modified example of FIG. 8. FIG. 10A is an enlarged view of one unit area 150AA of the first sensing portion 150 of FIG. 7. FIG. 10B is an enlarged view of one unit area 140AA of a second sensing portion 140 of FIG. 6.

Referring to FIGS. 6 through 10, the window 100 includes a display area 110 disposed at the center and a non-display area 120 that is disposed around the display area 110. The non-display area 120 may include a plurality of sensing portions 150 and 140. For ease of description, of the sensing portions 150 and 140, the sensing portion described above with reference to FIGS. 1 through 5 will be referred to as the first sensing portion 150, and a sensing portion adjacent to the first sensing portion 150 along the first direction X will be referred to as the second sensing portion 140.

The first sensing portion 150 and the second sensing portion 140 may independently detect a touch position and a touch pressure in response to a touch event of a user.

The first sensing portion 150 includes a first soft key area 150KA which partially transmits light emitted from the light source 220 to display a first soft key 150K and a first peripheral area 150NA which blocks the light emitted from the light source 220. Similarly, the second sensing portion 140 includes a second soft key area which partially transmits light emitted from the light source 220 to display a second soft key 140K different from the first soft key 150K and a second peripheral area which blocks the light emitted from the light source 220.

For example, a plurality of first holes 150H are formed in an area of a light shielding member 153 which overlaps the first soft key area 150KA of the first sensing portion 150.

According to an exemplary embodiment of the present disclosure, the first holes 150H may form a group to create a desired shape of the first soft key 150K visible from the outside of the display device 10 through the non-display area 120. Light provided from the light source 220 may transmit through the first holes 150H to display the first soft key 150K in the first soft key area 150KA. For example, a group of the first holes 150H is formed in the shape of the first soft key 150K. Therefore, a printed image layer having the shape of the first soft key 150K can be omitted.

However, according to an exemplary embodiment of the present disclosure, a printed layer having the shape of the first soft key 150K may be disposed in the first sensing portion 150. In this case, the first holes 150H may function as a light transmission path, for example, a path through which light emitted from the light source 220 travels.

Each of the first holes 150H may optionally have a quadrilateral cross-sectional shape.

According to an exemplary embodiment of the present disclosure, each of the first holes 150H may have a quadrilateral planar shape. For example, each of the first holes 150H may be shaped like a square having a length of 150HL, and a distance between the first holes 150H may be 150HD. Accordingly, the first holes 150H are separated from each other by the distance 150HD. The first holes 150H may all have the same length 150HL. Thus, the first holes 150H may all have the same size. For example, when the number of the first holes 150H included in a unit area 150AA is 13 as illustrated in the drawings, the total cross-sectional area of the first holes 150H included in the unit area 150AA may be $13 \times (150HL)^2$. When the total cross-sectional area of the first holes 150H increases, an aperture ratio per unit area 150AA of the first soft key area 150K increases. When the total cross-sectional area of the first holes 150H decreases, the aperture ratio per unit area 150AA of the first soft key area 150K decreases.

The first holes 150H may be spaced apart from each other. According to an exemplary embodiment of the present disclosure, the distance between the first holes 150H measured along a vertical direction in the drawings may be a first distance 150HD.

A width of each of the first holes 150H measured along a direction (e.g., a horizontal direction in the drawings) may be a first width 150HL.

According to an exemplary embodiment of the present disclosure, as illustrated in FIG. 9, each of a plurality of first holes 150H-C included in a unit area 150AA-C of a light shielding member 153-C may have a circular planar shape. For example, a cross-section of each of the first holes 150H-C may be shaped like a circle having a diameter of 150HL-C, and a distance between respective centers of the first holes 150H-C may be 150HD-C. For example, when the number of the first holes 150H-C included in a unit area 150AA-C is 13 as illustrated in the drawing, the total cross-sectional area of the first holes 150H-C included in the unit area 150AA-C may be $13 \times \{(150HL-C)/2\}^2 \times \pi$.

However, the planar shape and the cross-sectional shape of each of first holes 150H can be variously changed.

A plurality of second holes 140H are formed in an area of the light shielding member 153 which overlaps the second soft key area 140KA of the light shielding member 153 of the second sensing portion 140. The second holes 140H may form a group to create a desired shape of the second soft key 140K.

A planar shape and a cross-sectional shape of each of the second holes 140H may be the same as or different from those of each of the first holes 150H. Examples of the planar shape and the cross-sectional shape of each of the second holes 140H may be substantially the same as or similar to those of the planar shape and the cross-sectional shape of each of the first holes 150H.

The second holes 140H may be spaced apart from each other. According to an exemplary embodiment of the present disclosure, a distance between the second holes 140H measured along the vertical direction in the drawings may be a second distance 140HD.

A width of each of the second holes 140H measured along a direction (e.g., the horizontal direction in the drawings) may be a second width 140HL.

According to some exemplary embodiments of the present disclosure, an aperture ratio of the first sensing portion 150 and an aperture ratio of the second sensing portion 140 may be different from each other. The first distance 150HD and the first width 150H L may affect the aperture ratio of the first sensing portion 150, and the second distance 140HD. The second width 140HL may affect the aperture ratio of the second sensing portion 140. Therefore, the first distance 150HD and the second distance 140HD and/or the first width 150HL and the first distance 150HL may be different from each other in order to make the aperture ratio of the first sensing portion 150 and the aperture ratio of the second sensing portion 140 different.

For example, the first distance 150HD and the second distance 140HD may be different from each other, and the first width 150HL and the second width 140HL may be equal to each other. Alternatively, the first distance 10HD and the second distance 140HD may be equal to each other, and the first width 150HL and the second width 140HL may be different from each other. Alternatively, the first distance 150HD and the second distance 140HD may be different from each other, and the first width 150HL and the second width 140HL may be different from each other.

As described above, the first sensing portion 150 and the second sensing portion 140 can be formed to have different aperture ratios by varying the magnitude relationship between the first distance 150HD and the second distance 140HD and the magnitude relationship between the first width 150HL and the second width 140HL.

In addition, the first sensing portion 150 and the second sensing portion 140 can be formed to have different touch pressure sensing sensitivities by setting different aperture ratios for the first sensing portion 150 and the second sensing portion 140. This will be described in detail below with reference to FIG. 14.

Figure 12:
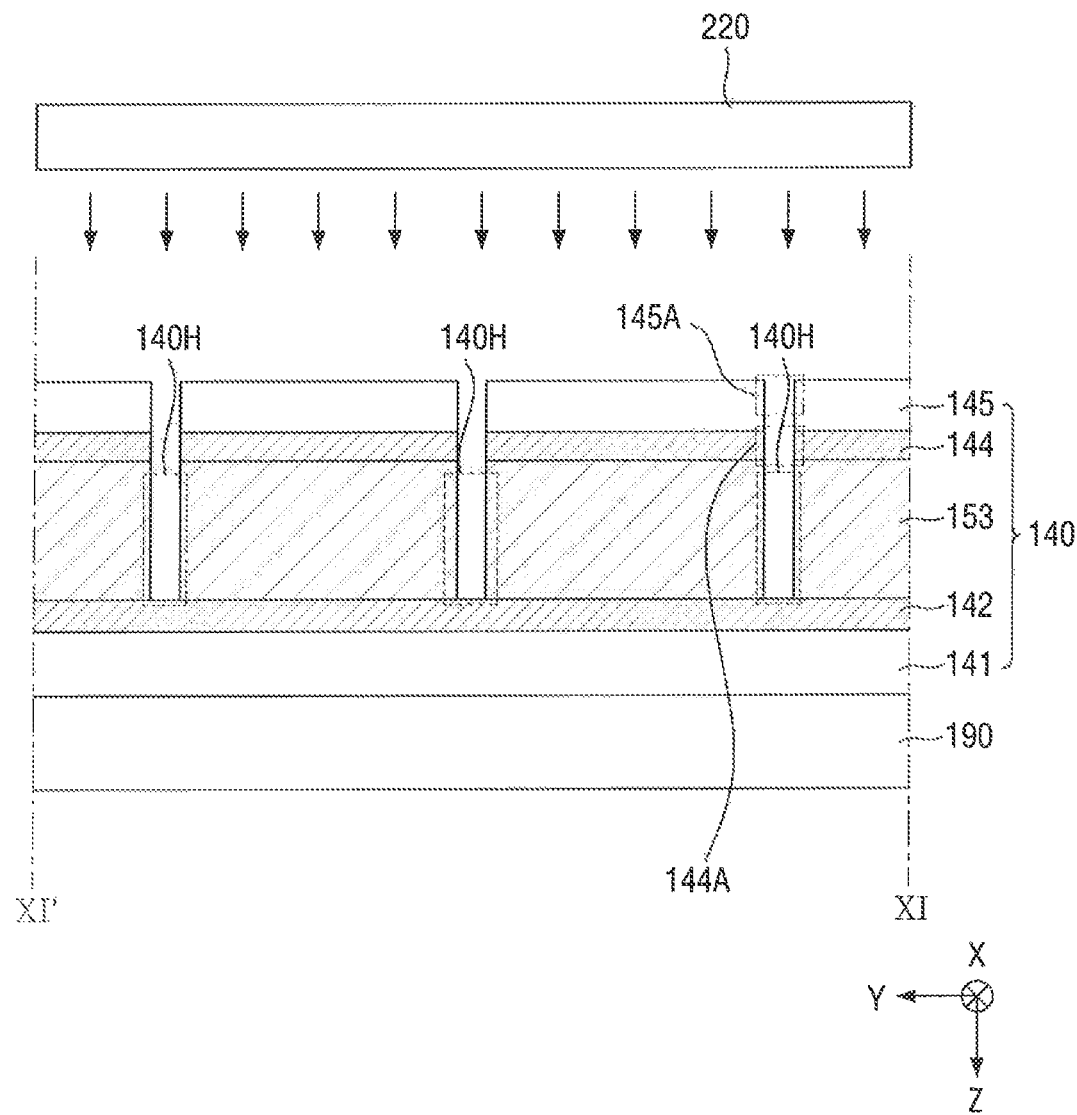
FIG. 12 is a cross-sectional view taken along the line XII-XII' of FIG. 10.
Figure 13A:
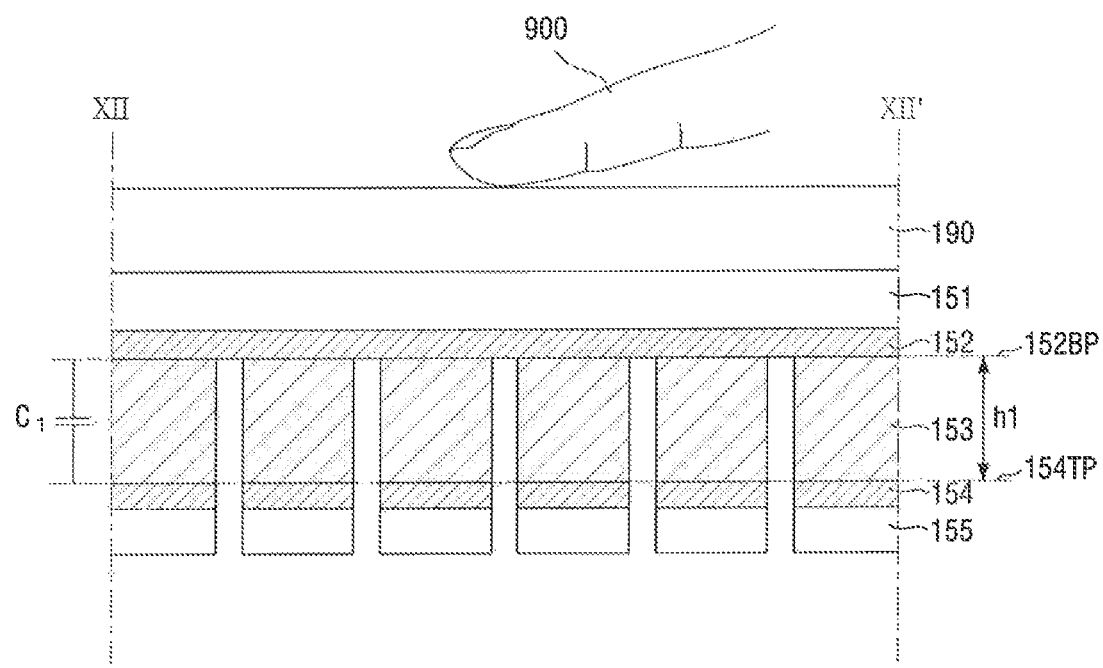
FIGS. 13A and 13B are enlarged views illustrating the first sensing portion operating as a pressure sensor in accordance with exemplary embodiments of the present disclosure.
Figure 13B:
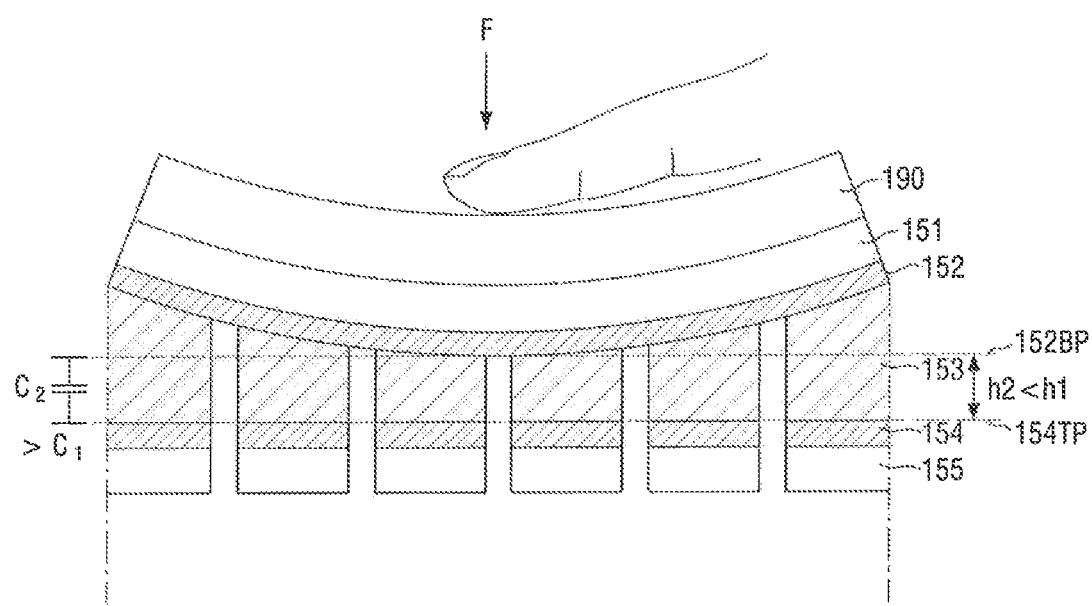
Figure 14A:
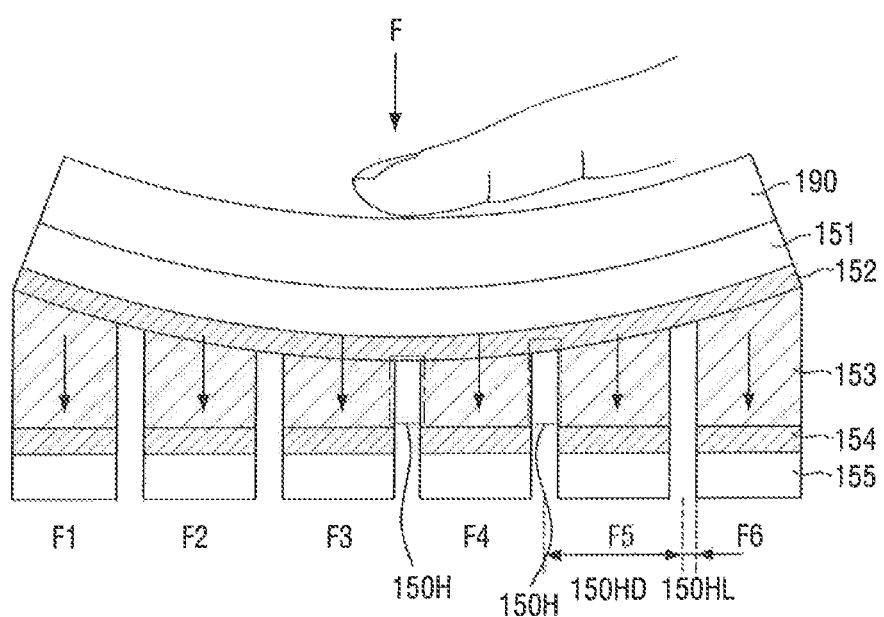
FIG. 14A is a cross-sectional view of the first sensing portion viewed from the same point of view as those of FIGS. 13A and 13B.
Figure 14B:
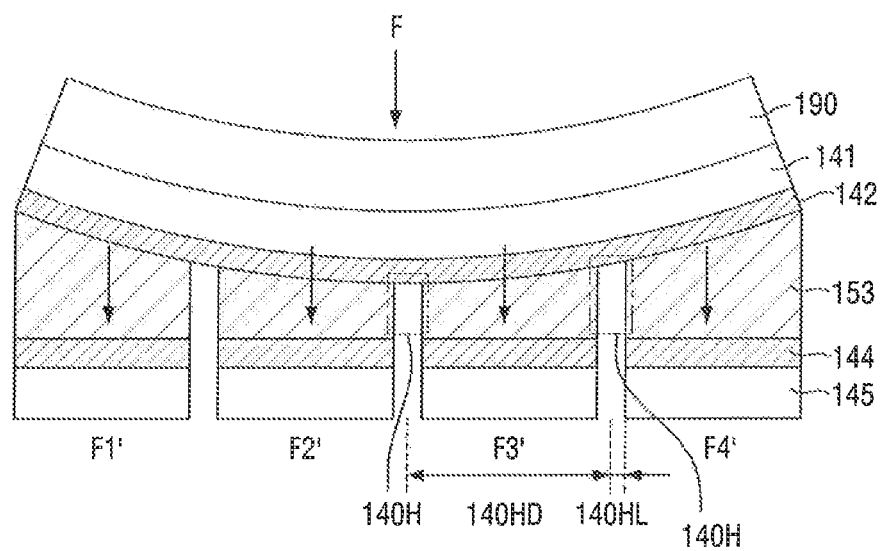
FIG. 14B is a cross-sectional view of the second sensing portion viewed from the same point of view as those of FIGS. 13A and 13B.

FIG. 11 is a partial cross-sectional view taken along the line XI-XI' of FIG. 10. FIG. 12 is a partial cross-sectional view taken along the line XII-XII' of FIG. 10. FIGS. 13A and 13B are enlarged views of the first sensing portion 150 operating as a pressure sensor. FIG. 14A is a partial cross-sectional view of the first sensing portion 150 viewed from the same point of view as those of FIGS. 13A and 13B. FIG. 14B is a partial cross-sectional view of the second sensing portion 140 viewed from the same point of view as those of FIGS. 13A and 13B.

Referring to FIGS. 11 through 14, the first sensing portion 150 may include a stack including a substrate 190, a first insulating layer 151, a first conductive layer 152, the light shielding member 153, a second conductive layer 154 and a second insulating layer 155, the stack overlapping a unit area 150AA.

A plurality of first holes 150H may be formed in a portion of the light shielding member 153 which is disposed in the first sensing portion 150.

A plurality of openings 154A overlapping the first holes 150H may be formed in the second conductive layer 154. In addition, a plurality of openings 155A overlapping the first holes 150H may be formed in the second insulating layer 155.

When light is provided from the light source 220 to the first sensing portion 150, a portion of the provided light is blocked by the light shielding member 153, but the other portion of the light is transmitted through the openings 155A of the second insulating layer 155, the openings 154A of the second conductive layer 154 and the first holes 150H and is emitted to the outside via the first conductive layer 152, the first insulating layer 151 and the substrate 190 made of an optically transparent material. Accordingly, a soft key of the first sensing portion 150 can be displayed.

The second sensing portion 140 may include a stack of the substrate 190, a third insulating layer 141, a third conductive layer 142, the light shielding member 153, a fourth conductive layer 144, and a fourth insulating layer 145.

The third conductive layer 142 of the second sensing portion 140 may include the same material as the first conductive layer 152, and the fourth conductive layer 144 of the second sensing portion 140 may include the same material as the second conductive layer 154.

The third insulating layer 141 of the second sensing portion 140 may include substantially the same material as the first insulating layer 151 of the first sensing portion 150. Similarly, the fourth insulating layer 145 of the second sensing portion 140 may include substantially the same material as the second insulating layer 155 of the first sensing portion 150.

A plurality of second holes 140H may be formed in a portion of the light shielding member 153 which is disposed in the second sensing portion 140.

A plurality of openings 144A overlapping the second holes 140H may be formed in the fourth conductive layer 144, and a plurality of openings 145A overlapping the second holes 140H may be formed in the fourth insulating layer 145.

When light is provided from the light source 220 to the second sensing portion 140, a portion of the provided light is blocked by the light shielding member 153, but the other portion of the light is transmitted through the openings 145A of the fourth insulating layer 145, the openings 144A of the fourth conductive layer 144 and the second holes 140H and emitted to the outside of the substrate 190 via the third conductive layer 142, the third insulating layer 141 and the substrate 190 made of an optically transparent material. Accordingly, a soft key of the second sensing portion 140 can be displayed.

In FIG. 11, the openings 155A are formed in the second insulating layer 155, and the openings 154A are formed in the second conductive layer 154. However, the inventive concept is not limited to this case. According to an exemplary embodiment of the present disclosure, opening might not be formed in the second insulating layer 155, and opening might also not be formed in the second conductive layer 154. For example, the first sensing portion 150 may include the light shielding member 153 having the first holes 150H, the second insulating layer 155 having no opening, and the second conductive layer 154 having no opening. Alternatively, the first sensing portion 150 may include the light shielding member 153 having the first holes 150H, the second insulating layer 155 having no opening, and the second insulating layer 155 having the openings 154A. Alternatively, the first sensing portion 150 may include the light shielding member 153 having the first holes 150H, the second insulating layer 155 having the openings 154A, and the second conductive layer having no opening.

Likewise, in FIG. 12, the openings 145A are formed in the fourth insulating layer 145, and the openings 144A are formed in the fourth conductive layer 144. However, unlike in the drawing, no opening might be formed in the fourth insulating layer 145, and no opening might be formed in the fourth conductive layer 144.

Referring to FIGS. 13A and 13B, a touch input 900 provided by a user may be provided to a first surface of the substrate 190 of the first sensing portion 150. As described above, the first sensing portion 150 is a pressure sensor in which the first conductive layer 152 functions as a first electrode, the second conductive layer 154 functions as a second electrode, and the light shielding member 153 functions as a dielectric having elasticity.

Here, the pressure is sensed by a touch controller of the touch member 300. The touch controller may sense the pressure using a self-capacitance method.

The touch controller may apply a driving signal to the first electrode and set the second electrode to ground GND. The touch controller may sense the pressure of a user's touch by sensing a change in a driving signal transmitted to the first electrode through a transmission line Tx and received through a reception line Rx (self-capacitance).

For example, when a touch input of a user is generated, the pressure of the touch input may be delivered to the first conductive layer 152 and the second conductive layer 154, thereby decreasing the distance between the first conductive layer 152 and the second conductive layer 154. As the distance between the first conductive layer 152 and the second conductive layer 154 decreases, the capacitance between the first conductive layer 152 and the second conductive layer 154 may increase. This increase in the capacitance may be detected by the touch controller, and the touch controller may calculate the magnitude of the pressure based on the increase in the capacitance.

The distance between one first hole 150H and another first hole 150H of the first sensing portion 150, which consists of the first insulating layer 151, the first conductive layer 152, the light shielding member 153, the second conductive layer 154 and the second insulating layer 155, may be designed to be 150HD, and the length of each first hole 150H may be designed to be 150HL. Here, a force F may be applied and distributed over the first sensing portion 150 as F1, F2, F3, F4, F5 and F6 within a unit area. The light shielding member 153 in the first sensing portion 150 may be deformed (e.g., contracted) by the force F applied to the first sensing portion 150.

The distance between one second hole 140H and another second hole 140H of the second sensing portion 140, which consists of the third insulating layer 141, the third conductive layer 142, the light shielding member 153, the fourth conductive layer 144 and the fourth insulating layer 145, may be designed to be 140HD. The length of each second hole 140H may be designed to be 140HL. Here, a force F may be applied and distributed over the second sensing portion 140 as F1', F2', F3' and F4'. The light shielding member 153 in the second sensing portion 140 may be deformed (e.g., contracted) by the force F applied to the second sensing portion 140.

Assuming that the widths or planar areas of the first holes 150H and the second holes 140H are equal, the number of the first holes 150H in the first sensing portion 150 may be greater than the number of the second holes 140H in the second sensing portions 140. For example, the aperture ratio of the first sensing portion 150 may be greater than the aperture ratio of the second sensing portion 140. In this case, if the same force F is applied to the first sensing portion 150 and the second sensing portion 140, the degree of deformation of the light shielding member 153 in the first sensing portion 150 may be greater than the degree of deformation of the light shielding member 153 in the second sensing portion 140. Accordingly, the sensing sensitivity of the first sensing portion 150 may be greater than the sensing sensitivity of the second sensing portion 140.

For example, if the light shielding member 153 functioning as a dielectric layer of the pressure sensor has a different aperture ratio in each of the first sensing portion 150 and the second sensing portion 140, the sensing sensitivity of the first sensing portion 150 and the sensing sensitivity of the second sensing portion 140 can be set differently.

Figure 15:
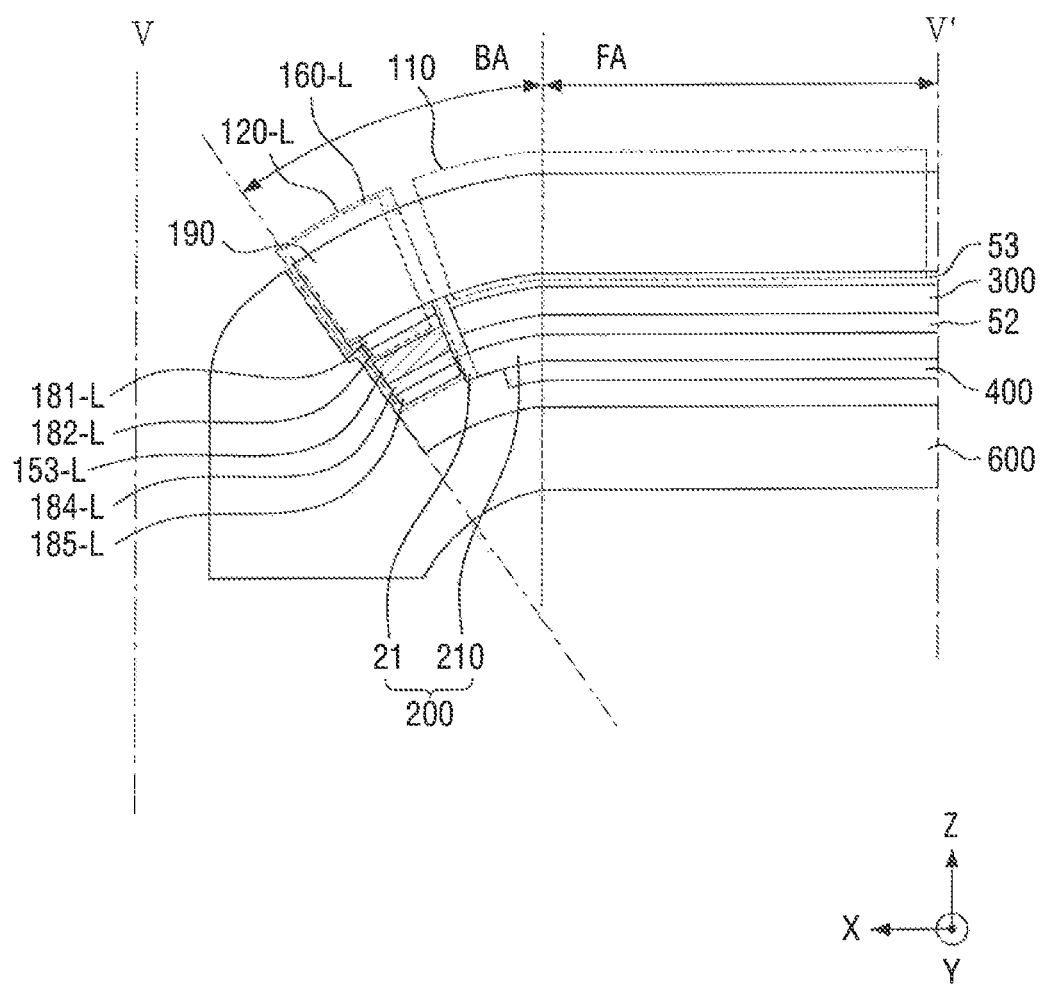
FIG. 15 is a cross-sectional view of a display device according to an exemplary embodiment of the present disclosure, viewed from the same point of view as that of FIG. 5.

FIG. 15 is a partial cross-sectional view of a display device according to an exemplary embodiment of the present disclosure, viewed from the same point of view as that of FIG. 5.

Referring to FIG. 15, the display device, according to an exemplary embodiment of the present disclosure, includes a non-display area 120-L. The non-display area 120-L may be disposed in a long side adjacent area and/or a short side adjacent area.

The non-display area 120-L includes a non-sensing portion 160-L. The non-sensing portion 160-L is disposed in the long side adjacent area.

Unlike the non-sensing portion 160 previously described which includes only the light shielding member 153 (FIG. 5), the non-sensing portion 160-L according to the present approach includes a fifth insulating layer 181-L which is disposed on a lower surface of a substrate 190 of the non-display area 120-L, a fifth conductive layer 182-L which is disposed on a second surface of the fifth insulating layer 181-L opposite to a first surface of the fifth insulating layer 181-L facing the substrate 190, a light shielding member 153-L which is disposed on a second surface of the fifth conductive layer 182-L opposite to a first surface of the fifth conductive layer 182-L facing the fifth insulating layer 181-L, a sixth conductive layer 184-L which is disposed on a second surface of the light shielding member 153-L opposite to a first surface of the light shielding member 153-L facing faces the fifth conductive layer 182-L, and a sixth insulating layer 185-L which is disposed on a second surface of the sixth conductive layer 184-L opposite to a first surface of the sixth conductive layer 184-L facing the light shielding member 153-L.

The fifth conductive layer 182-L and the sixth conductive layer 184-L are spaced apart from a first conductive layer 152 and a second conductive layer 154 of a sensing portion 150. The fifth conductive layer 182-L and the sixth conductive layer 184-L are disposed adjacent to the long side adjacent area of the non-display area 120-L, and the first conductive layer 152 and the second conductive layer 154 are disposed adjacent to the short side adjacent area of the non-display area 120-L.

The fifth conductive layer 182-L and the sixth conductive layer 184-L may include the same material as the first conductive layer 152 and the second conductive layer 154 of the sensing portion 150.

A display area 110, the substrate 190, transparent bonding layers 52 and 53, a touch member 300, a display panel 200, an under-panel sheet 400 and a bracket 600 may each be at least similar to corresponding elements described above with reference to FIG. 5.

Figure 16:
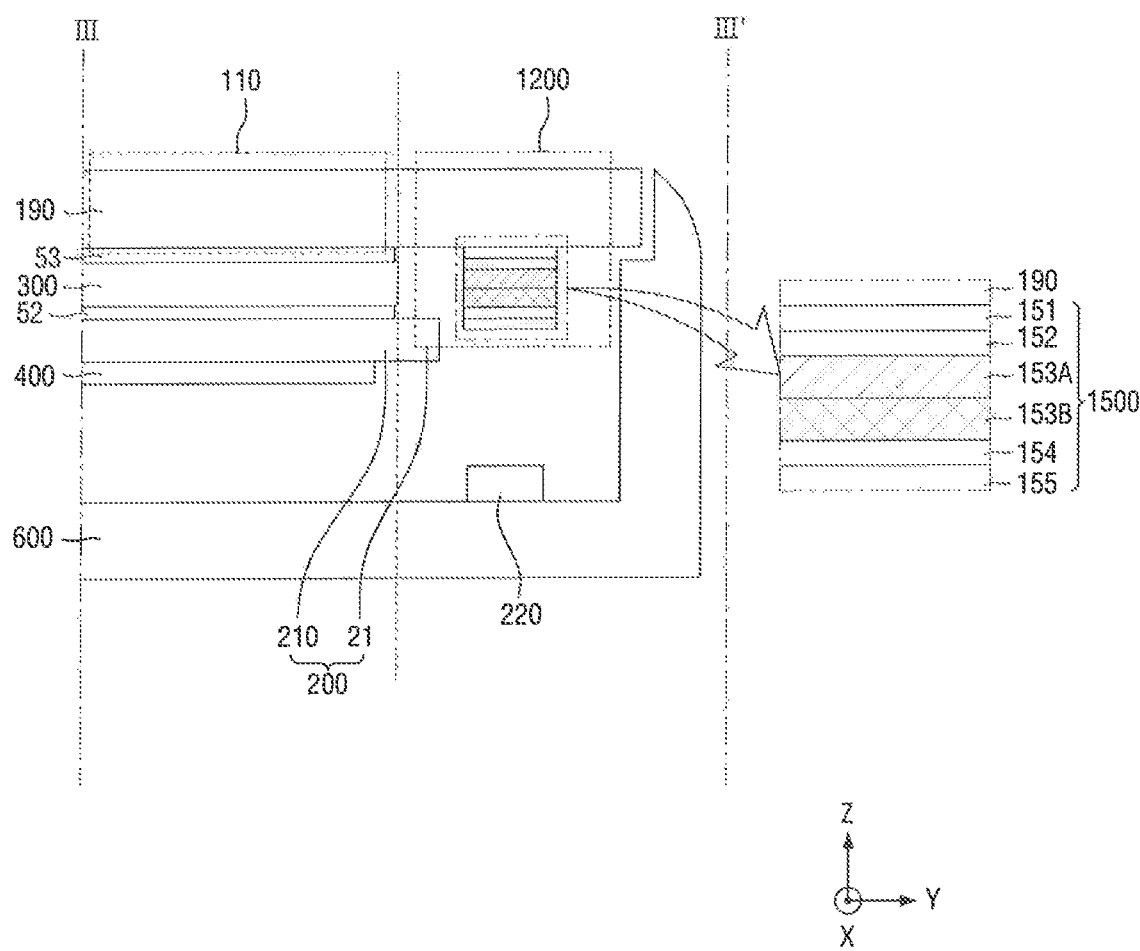
FIG. 16 is a cross-sectional view of a display device according to an exemplary embodiment of the present disclosure, viewed from the same point of view as that of FIG. 3.
Figure 17:
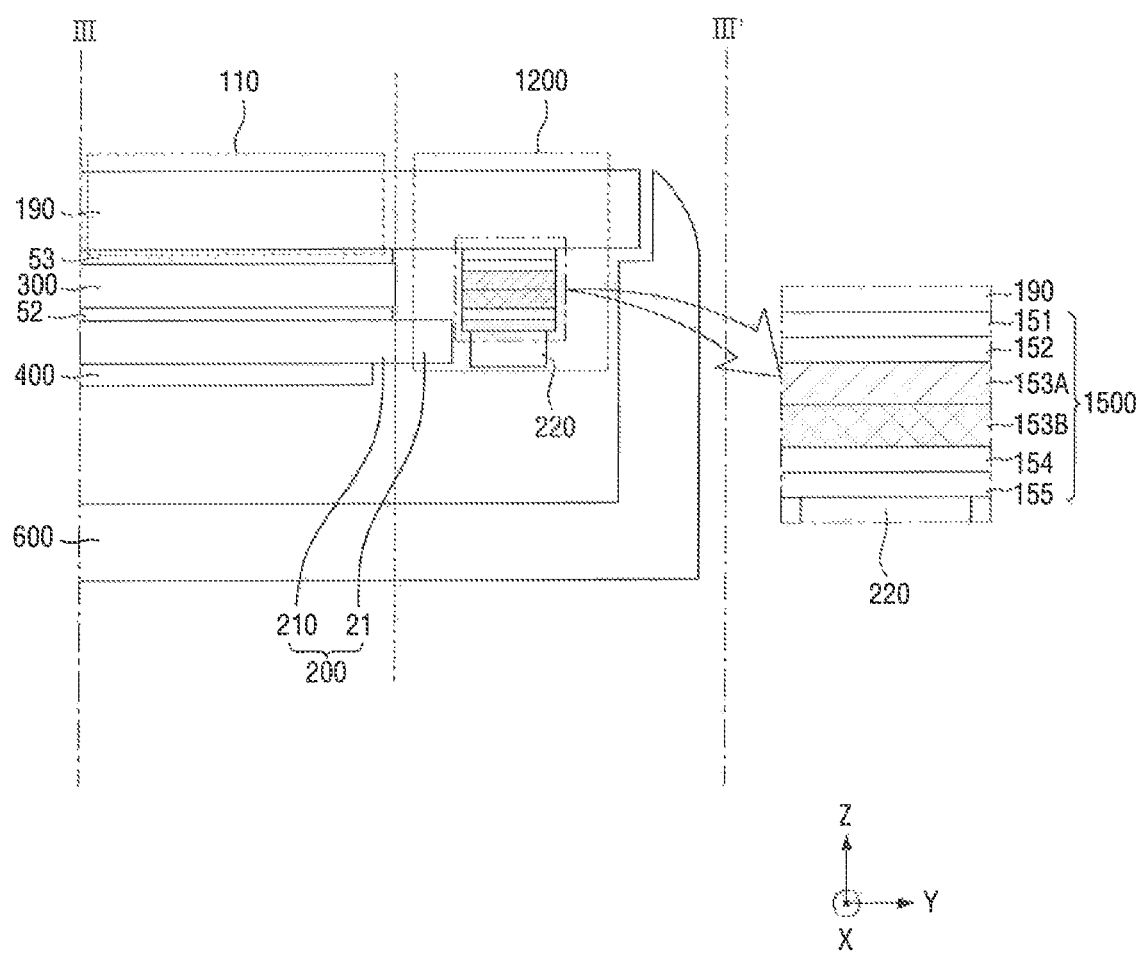
FIG. 17 is cross-sectional view of a display device according to an exemplary embodiment of the present disclosure, viewed from the same point of view as that of FIG. 3.
Figure 18:
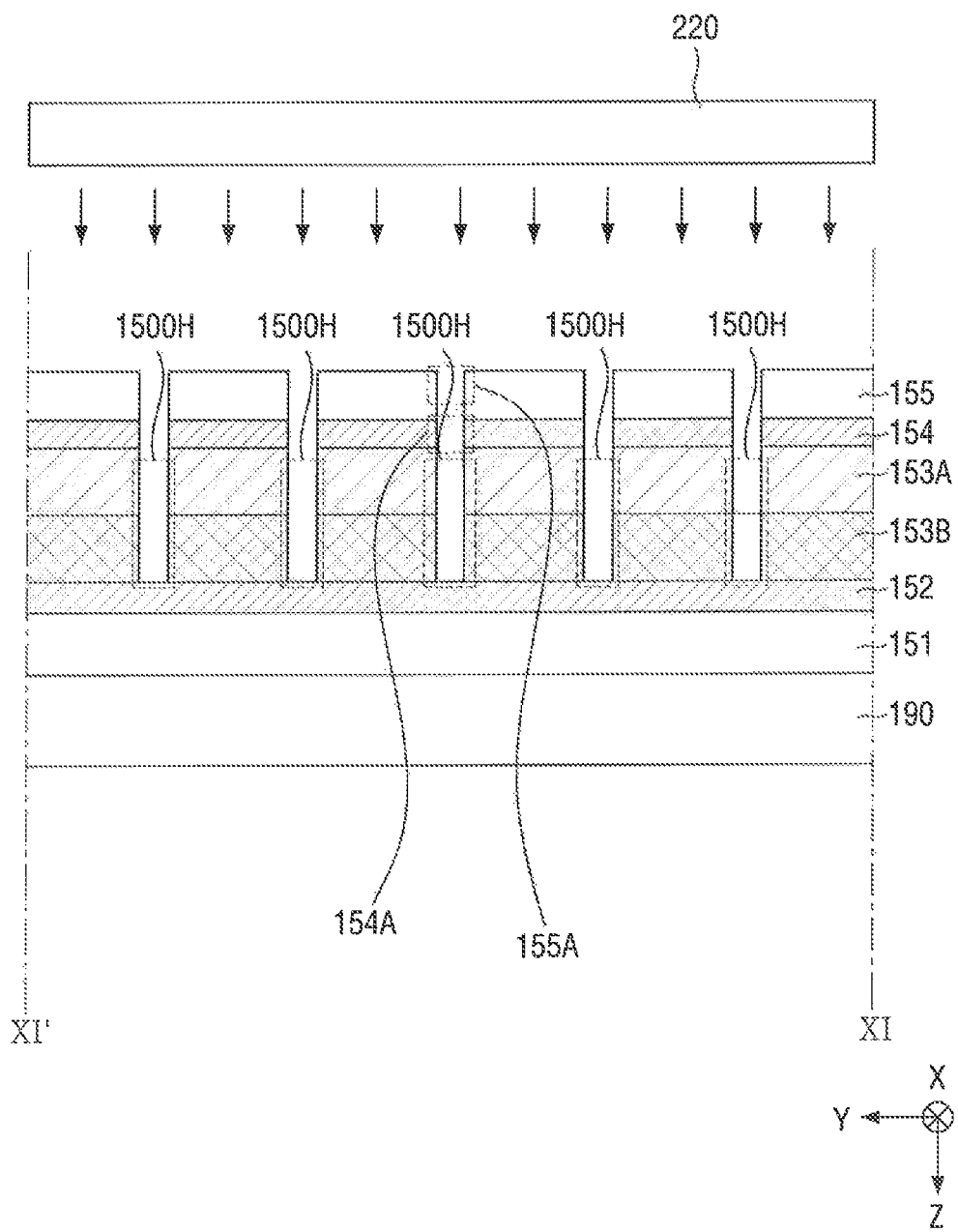
FIG. 18 is a cross-sectional view of a display device according to an exemplary embodiment of the present disclosure, viewed from the same point of view as that of FIG. 11.

FIG. 16 is a partial cross-sectional view of an a first display device according to an exemplary embodiment of the present disclosure, viewed from the same point of view as that of FIG. 3. FIG. 17 is a partial cross-sectional view of a second display device according to an exemplary embodiment of the present disclosure, viewed from the same point of view as that of FIG. 3. FIG. 18 is a partial cross-sectional view of a display device according to an exemplary embodiment of the present disclosure, viewed from the same point of view as that of FIG. 11.

Referring to FIGS. 16 through 18, a light shielding member of a first sensing portion 1500 disposed in a non-display area 1200 may include a first light shielding member 153A, which is disposed on a second surface of a first conductive layer 152 opposite to a first surface facing a first insulating layer 151, and a second light shielding member 153B, which is disposed between the first light shielding member 153A and a first conductive layer 154.

According to an exemplary embodiment of the present disclosure, the first light shielding member 153A and the second light shielding member 153B may include different materials. For example, the first light shielding member 153A and the second light shielding member 153B may include different light shielding materials. For example, when the first light shielding member 153A may include a first colored material having a first color, and the second light shielding member 153B may include a second colored material having a second color. For example, when the first light shielding member 153A includes a first light shielding material, the second light shielding member 153B may include a second light shielding material different from the first light shielding material.

A plurality of first holes 1500H may be formed in both the first light shielding member 153A and the second light shielding member 153B.

In the drawings, the light shielding member (153A and 153B) has a double-layer structure. However, the inventive concept is not limited to this case, and the light shielding member can also have a multilayer structure consisting of three or more layers.

The other components not specifically described here can be considered at least similar to corresponding components that have been described elsewhere in the present disclosure.

Figure 19:
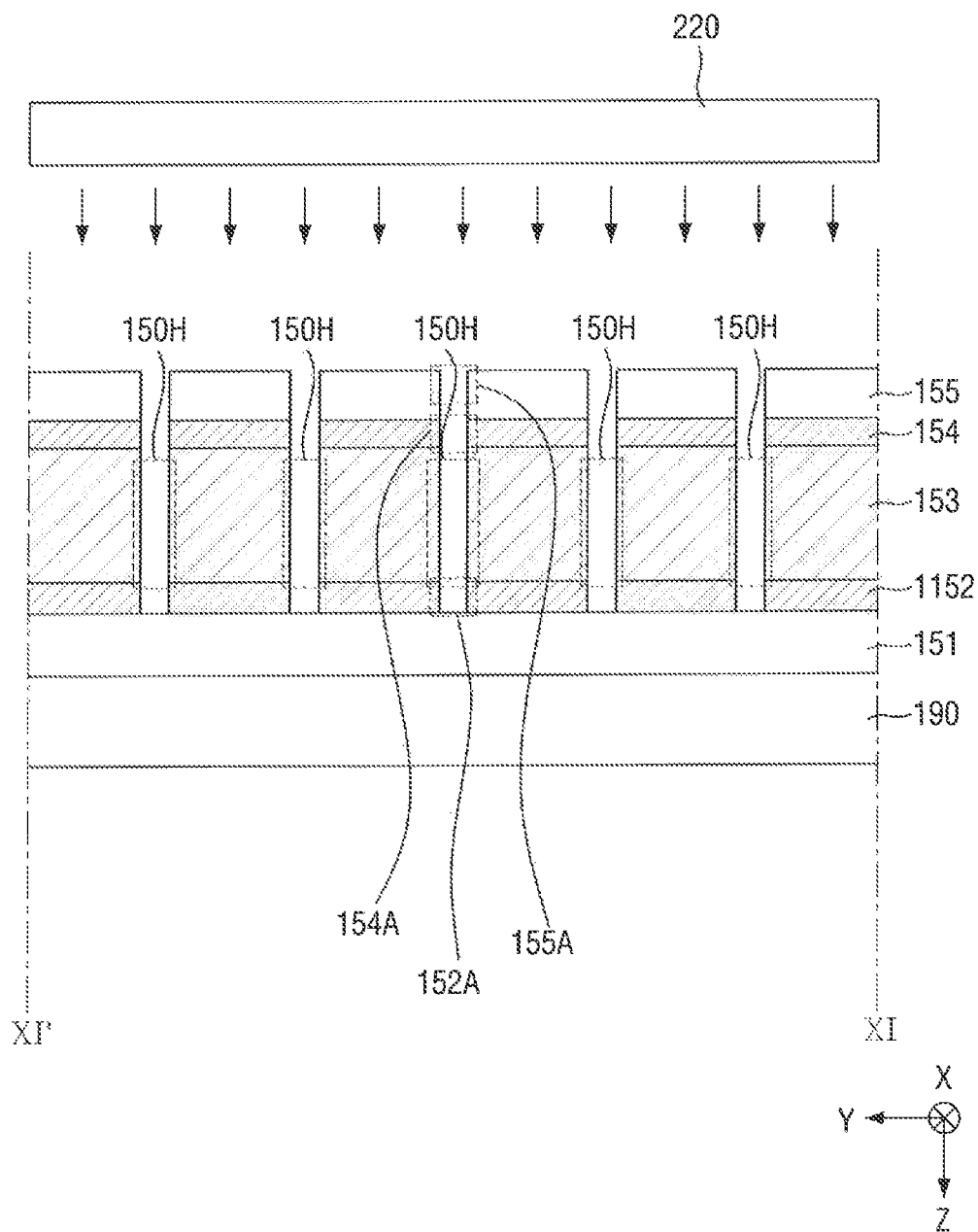
FIG. 19 is a cross-sectional view of a display device according to an exemplary embodiment of the present disclosure, viewed from the same point of view as that of FIG. 11.
Figure 20:
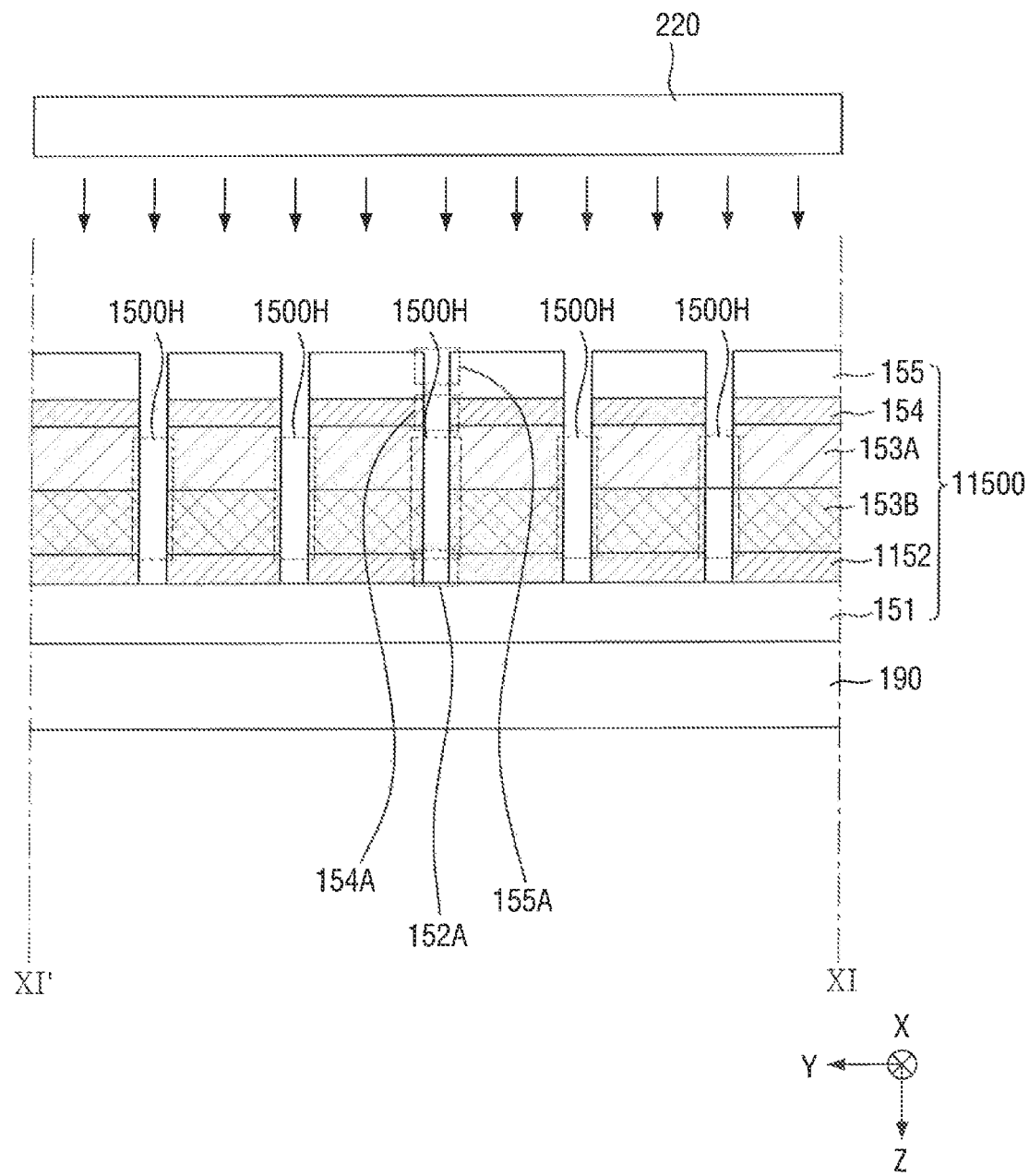
FIG. 20 is a cross-sectional view of a display device according to an exemplary embodiment of the present disclosure, viewed from the same point of view as that of FIG. 11.

FIG. 19 is a partial cross-sectional view of a first display device according to an exemplary embodiment of the present disclosure, viewed from the same point of view as that of FIG. 11. FIG. 20 is a partial cross-sectional view of a second display device according to an exemplary embodiment of the present disclosure, viewed from the same point of view as that of FIG. 11.

Referring to FIGS. 19 and 20, a light shielding member 153 includes a plurality of first holes 150H. A second conductive layer 154 includes one or more openings 154A overlapping the first holes 150H, and a second insulating layer 155 includes one or more openings 155A overlapping the openings 154A formed in the second conductive layer 154.

A first conductive layer 1152 disposed between the light shielding member 153 and a first insulating layer 151 includes one or more openings 152A formed in portions that overlap the first holes 150H.

Accordingly, more light emitted from a light source 220 can pass through a first sensing portion 1150 or 11500 having the openings 152A formed in the first conductive layer 1152 than when no opening is formed in the first conductive layer 1152 as discussed above with reference to FIG. 1.

The components not described herein may be understood to be at least similar to corresponding components described elsewhere within the present disclosure.

Figure 21:
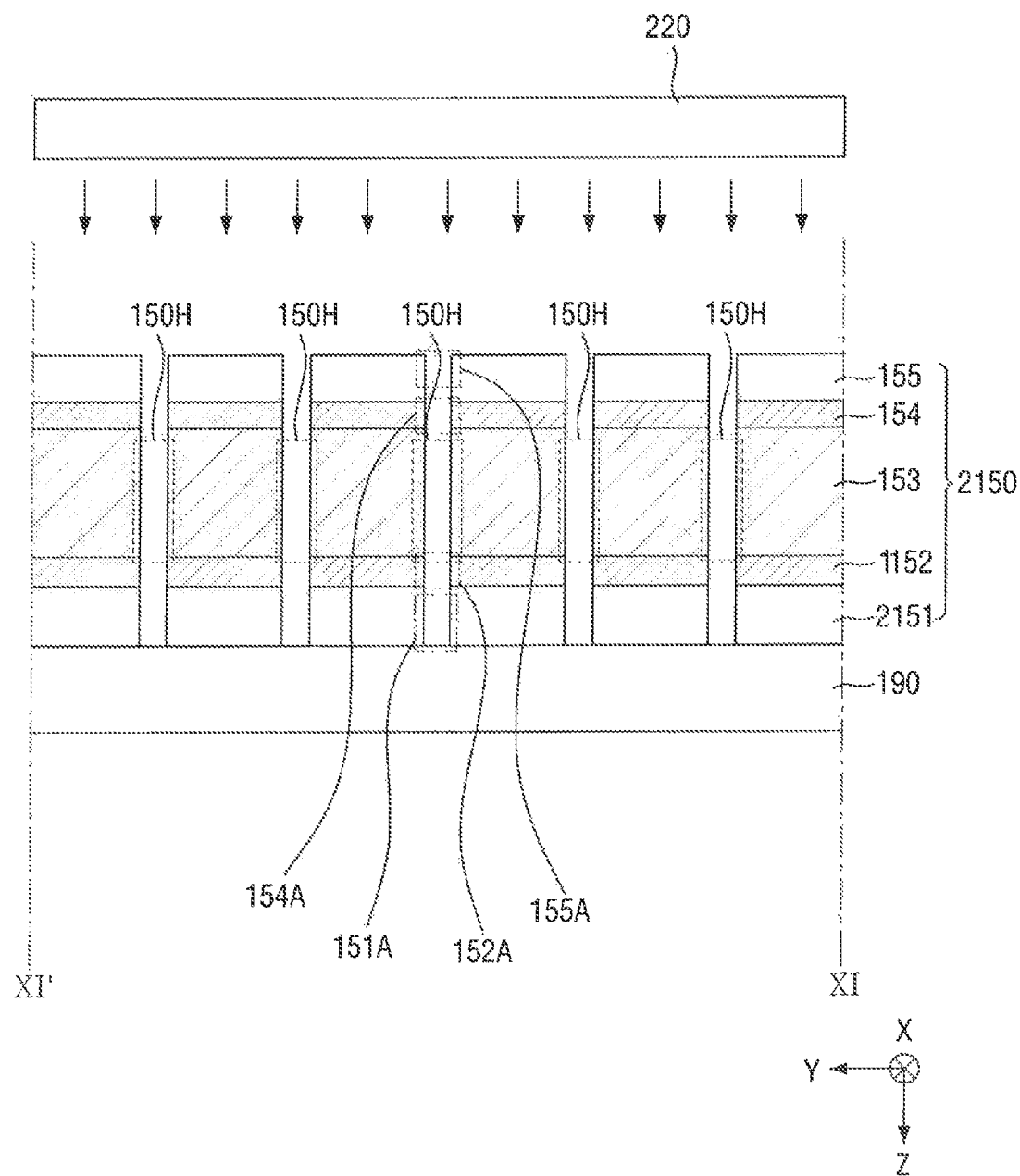
FIG. 21 is a cross-sectional view of a display device according to an exemplary embodiment of the present disclosure, viewed from the same point of view as that of FIG. 11.
Figure 22:
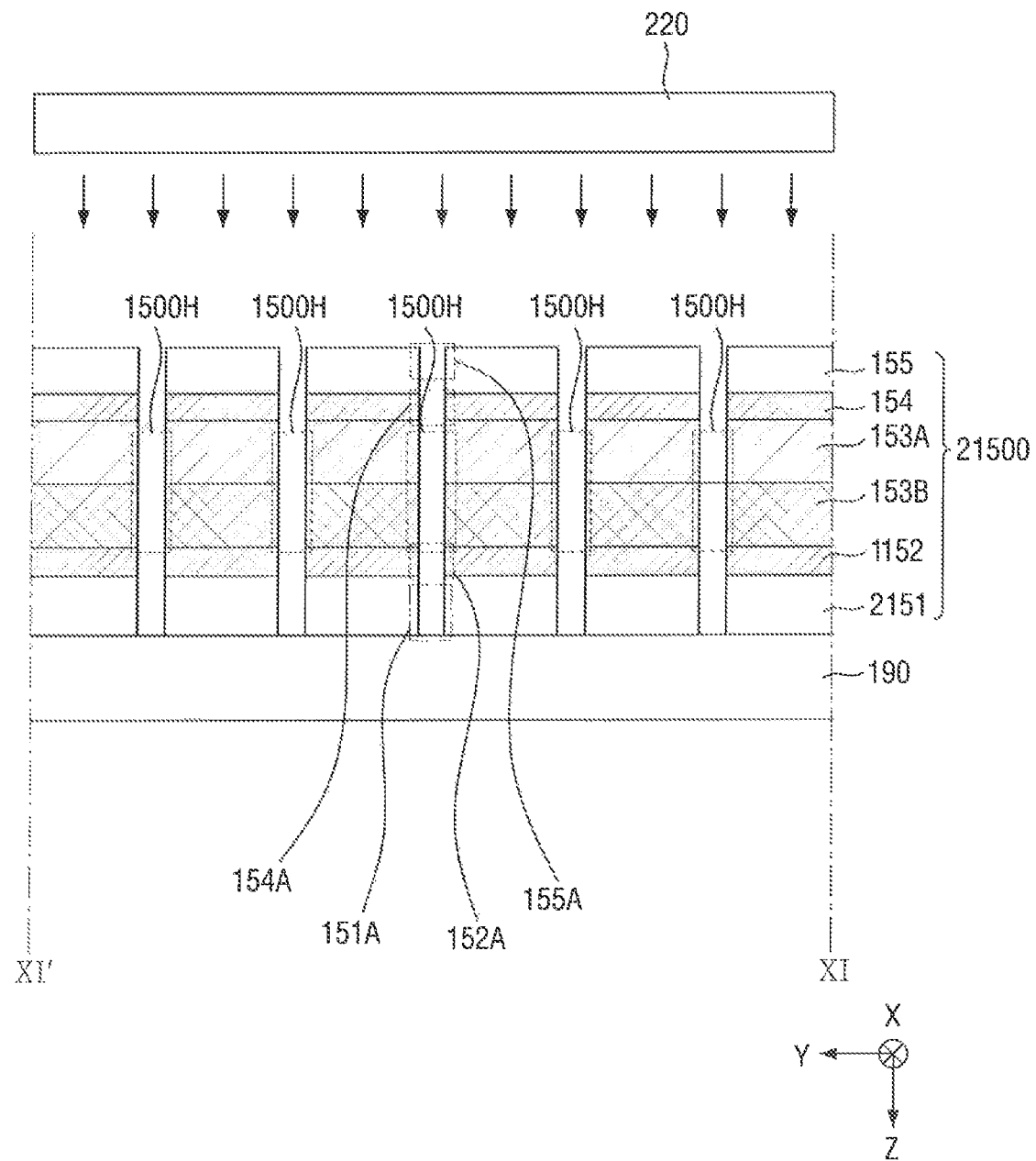
FIG. 22 is a cross-sectional view of a display device according to an exemplary embodiment of the present disclosure, viewed from the same point of view as that of FIG. 11.

FIG. 21 is a partial cross-sectional view of a first display device according to an exemplary embodiment of the present disclosure, viewed from the same point of view as that of FIG. 11. FIG. 22 is a partial cross-sectional view of a second display device according to an exemplary embodiment of the present disclosure, viewed from the same point of view as that of FIG. 11.

Referring to FIGS. 21 and 22, a light shielding member 153 includes a plurality of first holes 150H. A second conductive layer 154 includes one or more openings 154A overlapping the first holes 150H, and a second insulating layer 155 includes one or more openings 155A overlapping the openings 154A formed in the second conductive layer 154.

A first conductive layer 1152 may include one or more openings 152A formed in portions overlapping the first holes 150H, and a first insulating layer 2151 disposed between the first conductive layer 1152 and a substrate 190 may include one or more openings 151A overlapping the openings 152A.

Accordingly, more light emitted from a light source 220 can pass through a first sensing portion 2150 or 21500 having the openings 151A formed in the first insulating layer 2151 than when no opening is formed in the first insulating layer 151 as in the embodiment of FIG. 19.

The other components not specifically described here can be considered at least similar to corresponding components that have been described elsewhere in the present disclosure.

Figure 23:
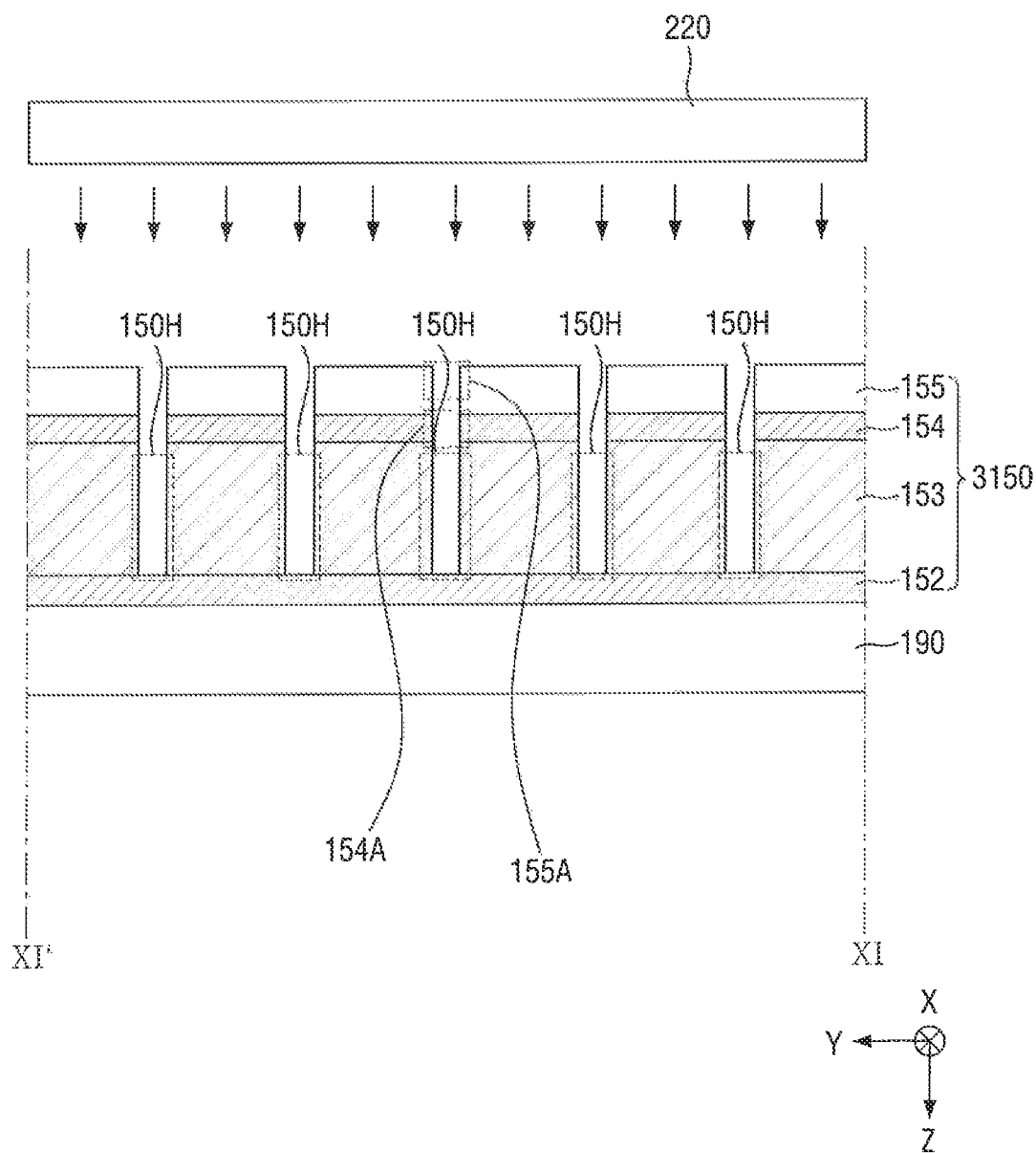
FIG. 23 is a cross-sectional view of a display device according to an exemplary embodiment of the present disclosure, viewed from the same point of view as that of FIG. 11.
Figure 24:
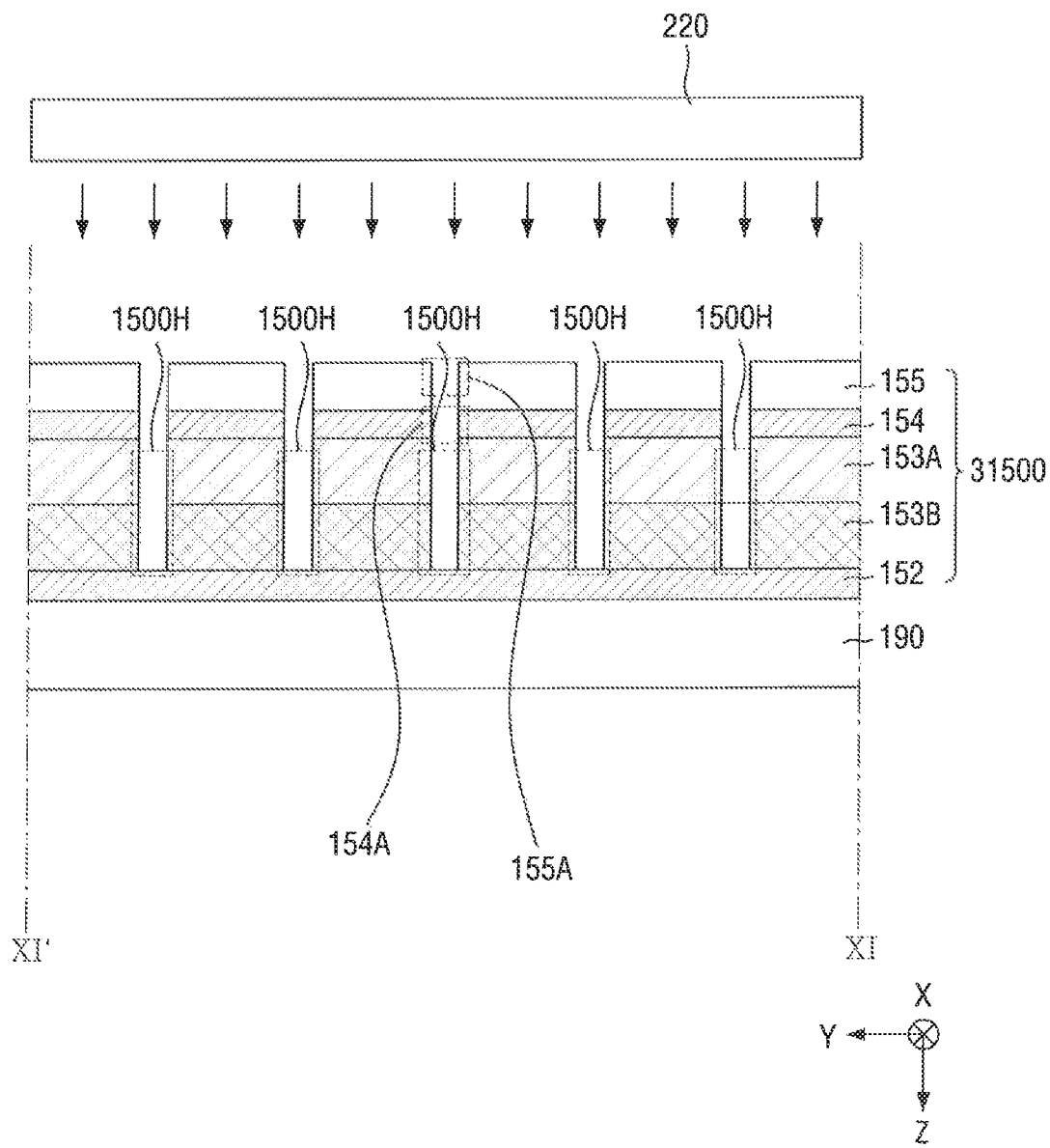
FIG. 24 is a cross-sectional view of a display device according to an exemplary embodiment of the present disclosure, viewed from the same point of view as that of FIG. 11.
Figure 25:
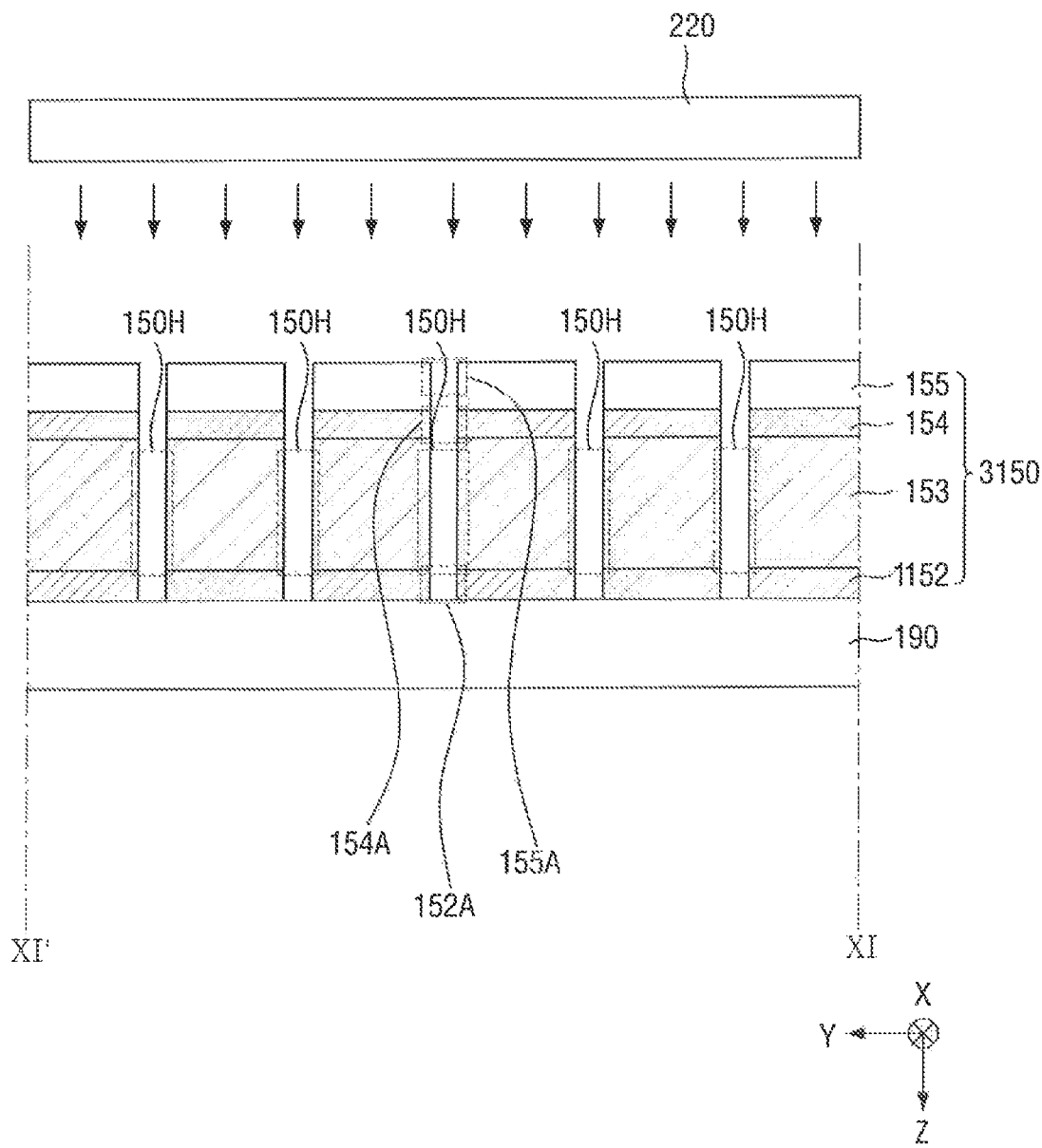
FIG. 25 is a cross-sectional view of a display device according to an exemplary embodiment of the present disclosure, viewed from the same point of view as that of FIG. 11.
Figure 26:
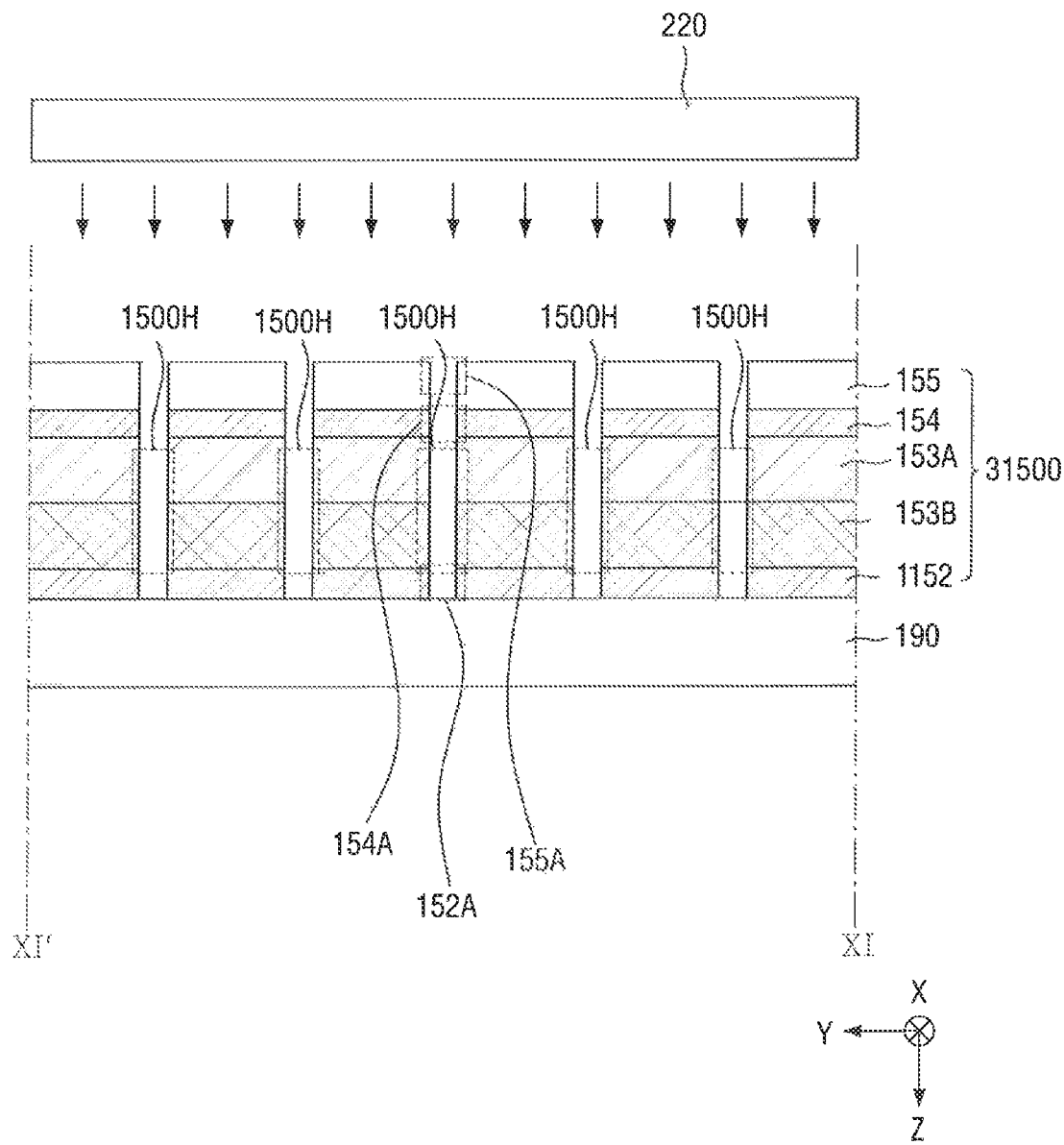
FIG. 26 is a cross-sectional view of a display device according to an exemplary embodiment of the present disclosure, viewed from the same point of view as that of FIG. 11.

FIG. 23 is a partial cross-sectional view of a first display device according to an exemplary embodiment of the present disclosure, viewed from the same point of view as that of FIG. 11. FIG. 24 is a partial cross-sectional view of a second display device according to an exemplary embodiment of the present disclosure, viewed from the same point of view as that of FIG. 11. FIG. 25 is a partial cross-sectional view of a third display device according to an exemplary embodiment of the present disclosure, viewed from the same point of view as that of FIG. 11. FIG. 26 is a partial cross-sectional view of a fourth display device according to an exemplary embodiment of the present disclosure, viewed from the same point of view as that of FIG. 11.

Referring to FIGS. 23 through 26, in first sensing portions 3150 and 31500, a first insulating layer 151 is not formed, and a first conductive layer 152 is formed on a lower surface of a substrate 190.

In this case, light emitted from a light source 220 toward the substrate 190 can pass through one or more openings 155A, 154A and 152A and then directly pass through the substrate 190 without passing through the first insulating layer 151. Therefore, the visibility of a soft key can be further increased.

The other components not specifically described here can be considered at least similar to corresponding components that have been described elsewhere in the present disclosure.

According to exemplary embodiments of the present disclosure, a user's input to a soft key of a non-display area can be sensed more precisely.

According to exemplary embodiments of the present disclosure, a user's input to each soft key can be sensed with a different degree of prevision.

According to exemplary embodiments of the present disclosure, the visibility of soft keys can be increased while a user's input to each soft key of a non-display area is sensed precisely.

While the inventive concept has been particularly illustrated and described with reference to exemplary embodiments thereof, it will be understood by those of ordinary skill in the art that various changes in form and detail may be made therein without departing from the spirit and scope of the present disclosure.

What is claimed is:

1. A display device, comprising:
a display panel comprises a display portion; and
a window disposed above the display portion, the window comprising a display area, on which a screen is displayed by the display portion, and a non-display area, disposed around the display area,
wherein the non-display area of the window includes a first sensing portion and a second sensing portion,
wherein the non-display area of the window comprises a light shielding member,
wherein the first sensing portion comprises a first conductive layer, a second conductive layer stacked on the first conductive layer, and the light shielding member interposed between the first conductive layer and the second conductive layer, and
wherein the second sensing portion comprises a third conductive layer, a fourth conductive layer stacked on the third conductive layer, and the light shielding member is interposed between the third conductive layer and the fourth conductive layer.

2. The display device of claim 1, wherein a portion of the light shielding member which is disposed in the first sensing portion comprises a plurality of first holes,
wherein a portion of the light shielding member which is disposed in the second sensing portion comprises a plurality of second holes, and
wherein an aperture ratio of each of the plurality of first holes is different from an aperture ratio of each of the plurality of second holes.

3. The display device of claim 2, wherein a gap between each of the plurality of first holes that are adjacent along a first direction is different from a gap between each of the plurality of second holes that are adjacent along the first direction.

4. The display device of claim 2, wherein a width of each of the plurality of first holes measured along a second direction is different from a width of each of the plurality of second holes measured along the second direction.

5. The display device of claim 1, further comprising a light source which overlaps the first sensing portion and the second sensing portion and provides light to the first sensing portion and the second sensing portion.

6. The display device of claim 1, wherein the light shielding member is a first light shielding member and the display device further includes a second light shielding member disposed between the first light shielding member and the second conductive layer.

7. The display device of claim 6, wherein a portion of the second light shielding member which is disposed in the sensing portion includes a different material from that of the first light shielding member.

8. The display device of claim 6, wherein the first conductive layer comprises a first surface facing the light shielding member and a second surface opposite to the first surface, and
wherein the window further comprises a substrate disposed on the second surface of the first conductive layer.

9. The display device of claim 8, wherein the window further comprises a first insulating layer disposed between the first surface of the first conductive layer and the substrate.

10. The display device of claim 9, wherein a portion of the light shielding member which is disposed in the first sensing portion or the second sensing portion comprises a hole, and the first insulating layer comprises a first opening overlapping the hole.

11. The display device of claim 10, wherein the first insulating layer comprises a light shielding material.

12. The display device of claim 10, wherein the second conductive layer comprises a first surface facing the first light shielding member and a second surface opposite to the first surface, and wherein the window further comprises a second insulating layer disposed on the second surface of the second conductive layer.

13. The display device of claim 12, wherein the second insulating layer comprises a second opening overlapping the hole.

14. The display device of claim 6, further comprising a fifth conductive layer and a sixth conductive layer which are each disposed in a non-sensing portion with the first light shielding member interposed between the fifth conductive layer and the sixth conductive layer.

15. The display device of claim 14, wherein each of the first conductive layer and the second conductive layer are spaced apart from each of the fifth conductive layer and the sixth conductive layer, respectively.

16. The display device of claim 15, wherein the window includes two short sides extending along a first direction and two long sides extending along a second direction intersecting the first direction, and
wherein the non-display area includes a long side adjacent area disposed adjacent to either or both of the two long sides of the window and the non-display area further includes a short side adjacent area disposed adjacent to either or both of the two short sides of the window, and
wherein the fifth conductive layer and the sixth conductive layer are each disposed in the long side adjacent area, and the first conductive layer and the second conductive layer are each disposed in the short side adjacent area.

* * * * *